United States Patent [19]
Proskauer et al.

[11] Patent Number: 5,910,895
[45] Date of Patent: Jun. 8, 1999

[54] LOW COST, EASY TO USE AUTOMATIC TEST SYSTEM SOFTWARE

[75] Inventors: Daniel C. Proskauer, Newtown; Pradeep B. Deshpande, Burlington, both of Mass.

[73] Assignee: Teradyne, Inc., Boston, Mass.

[21] Appl. No.: 08/874,615

[22] Filed: Jun. 13, 1997

[51] Int. Cl.[6] ............................. G01R 31/28; H01L 21/66
[52] U.S. Cl. ...................... 364/468.28; 364/488; 364/489
[58] Field of Search ................................ 364/468.28, 221, 364/282.1, 480, 489, 490, 491; 395/10, 11, 68; 707/503, 104; 324/73.1

[56] References Cited

U.S. PATENT DOCUMENTS

| | | | |
|---|---|---|---|
| 5,371,851 | 12/1994 | Pieper et al. | 395/164 |
| 5,471,612 | 11/1995 | Schlafly | 707/104 |
| 5,495,578 | 2/1996 | Rohrbaugh et al. | 395/185.04 |
| 5,499,180 | 3/1996 | Ammirato et al. | 707/503 |
| 5,603,021 | 2/1997 | Spencer et al. | 707/4 |
| 5,673,272 | 9/1997 | Proskauer et al. | 324/73.1 |
| 5,721,847 | 2/1998 | Johnson | 345/333 |

FOREIGN PATENT DOCUMENTS

3844036 A1  7/1989  Germany ......................... G06F 11/30

OTHER PUBLICATIONS

Electric Design News, Apr. 15, 1993. No. 8, Newtown, MA. pp. 185–187.
Microsoft Excel Visual Basic User's Guide (1994), pp. 41,45,46,14,78.
Instrumentation Reference and Catalogue, 1997, National Instruments Corporation; p. 2–70 to 2–72.
Data Acquisition and Computer Interfaces, New Horizons, Special Edition, vol. 16, No. 3, Copyright Omega Engineering, Inc. 1997.
Data–acquisition software on Excel, *Electronic Engineering Times*, Sep. 25, 1995.
Steve Lekas, Software Components Usher in Seamless Data Acquisition, EE–Evaluation Engineering, Dec. 1995.
DaqViewXL Data Sheet, IO tech, no date.
Driver488/W95 Data Sheet, IOtech, no date.
IEEE 488 & Data Acquisition Catalog for 1995. IOtech, pp. 77,79,89,91,101,205,211,213,215,217,219.
J971 Series IG900+ Manual, v2.5, May 1993, pp. 1.1–1.28.
Image ExPress Code–Producing Displays; CATD Software For The A500 Family Of Tests Systems, Teradyne, 1991.

*Primary Examiner*—John Barlow
*Assistant Examiner*—Bryan Bui
*Attorney, Agent, or Firm*—Edmund J. Walsh

[57] ABSTRACT

Automatic test equipment for semiconductor devices with low cost, easy to use software for developing and executing test programs. The tester is controlled with a computer work station running a commercially available spread sheet program. The commercially available spread sheet program is set as an application to provide a program development environment. In addition, programs made with the commercially available spread sheet program control the execution of tests on semiconductor devices. The tester is easy to program because use of the commercially available spread sheet program generates well known programming interfaces. In this way, the commercially available spread sheet program implements the software controlling the tester rather than merely providing spread sheet functions used by the application. The software controlling the automatic test equipment is therefore very easy to program or modify. It is also very easy to program.

14 Claims, 23 Drawing Sheets

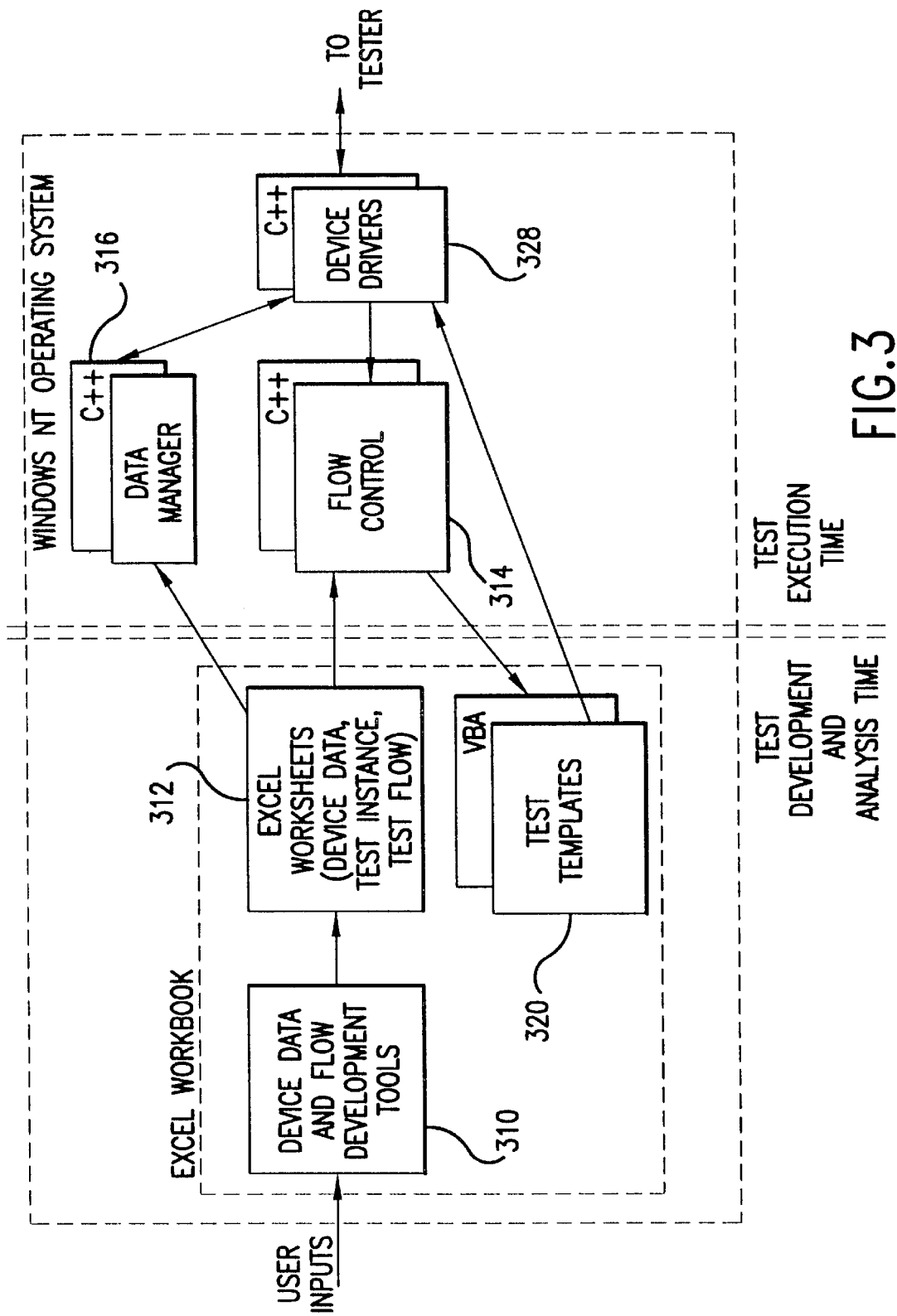

LOW COST, EASY TO USE AUTOMATIC
TEST SYSTEM SOFTWARE

This invention relates generally to automatic test equipment used in the manufacture of semiconductors and more specifically to the controlling software for such test systems.

Automatic test equipment is widely used in the manufacture of semiconductors. Semiconductors are generally tested at least once during their manufacture and are sometimes tested at more than one step in the manufacturing process. Because every component is tested, speed of testing is critical to the economic manufacture of semiconductors. Slow testing prevents full utilization of the expensive capital equipment needed to produce semiconductor components.

Modern semiconductor components are very complicated and have many operating states. Each of these operating states must be exercised to perform a complete test. Automatic test equipment is therefore designed to apply test data to a semiconductor device and make numerous measurements very quickly in a production setting. FIG. 1 shows a generalized automatic test system of the prior art. To provide thorough and fast testing, the automatic test system generally includes a tester body 112, a computerized work station 110 and a handling device 114.

The computer work station 110 controls both the handling device 114 and the tester body 112. It controls the handling device 114 to position the semiconductor device (not shown) where it makes contacts with numerous test probes 118 on the tester body 112. Often, a tester will include a separate test head containing test probes 118. However, such a distinction is not important for the invention.

Work station 110 then controls tester body 112 to run a series of tests on the device under test. Each test generally includes a setup portion in which control signals are sent from the work station 110 to the tester body 112. The control signals are usually digital values sent over bus 116. These control signals configure the hardware within tester body 112 to make the measurements required for the test. The hardware within the tester body provides stimulus and measures responses from the device under test in accordance with the control signals.

FIG. 1 shows that the hardware within tester body 112 includes numerous circuits identified as pins 124. Each pin 124 generates signals or makes measurements for one of the test probes 118. Each pin might provide or measure a static, or DC, signal. Alternatively, each pin 124 might provide or measure changing data in what is sometimes called a "burst".

During a burst, tester body 120 is controlled by timing and sequencing circuit 120. Timing and sequencing circuit 120 causes each of the pins 124 to read a sequence of data values from an associated memory 128. Each data value indicates the type of signal the pin should apply or expect to measure at its associated test probe 118 at a specific point in time. If the pin compares a measurement to an expected value, the results might also be stored in memory 128.

The set of data values that define the values all the pins 124 should provide or expect to measure at one time is called a "vector." During a burst, many vectors are executed. The vectors must be executed at a very high rate to simulate actual operating conditions of the device under test. There are usually millions of vectors to define the bursts needed to test a semiconductor device. The vectors are typically loaded into memories 128 at the time test system is programmed to test a particular type of part. This loading process might take several minutes and is not repeated for each burst. Rather, for each burst, work station 110 sends commands indicating which vectors are to be executed as part of the burst. Once the burst is completed, work station 110 reads the results of the burst from memory 128 or timing and sequencing circuit 120.

In addition, tester body 112 includes one or more instruments 126. An instrument performs a specific test function. It might for example generate a specific test signal such as a sine wave. Alternatively, an instrument might sample a signal at a high rate so that it can later be analyzed by a digital signal processor. These functions might be performed as part of a burst or might be performed separate from a burst.

A full test of a part, sometimes called a "job", will consist of a series of bursts interspersed with DC measurements or measurements by instruments 126. The bursts might be used to measure specific functional attributes of the device under test. Alternatively, each burst might be used only to place the device under test into a state in which a DC measurement can be taken. The order in which these elements of a test are performed, sometimes called the "flow," is dictated by software in work station 110.

Once a device has been fully tested, or tested to the point where it is determined to be defective, work station 110 generates control signals to the handling device 114. Handling device 114 then presents the next device to be tested to tester body 112 and the process is repeated. Work station 110 also gathers data about whether particular devices passed or failed. It can process this data so that defective devices are discarded or it can perform other functions, such as analyzing the data for failure trends.

One other important function of the software inside work station 110 is that it aids in the development of tests for a particular device or even during design of the device itself. During development, a test engineer must be able to specify such things as the settings for the hardware within tester body 112. The engineer also must be able to specify the flow of the test. It is highly desirable that the software controlling the tester be flexible and also very easy to learn and use. The semiconductor chip market is very competitive, driven in large part by technical innovation. It is therefore important that chips be developed and made ready for manufacture as quickly as possible. It is undesirable if delays are introduced because test engineers need to learn how to program a tester.

FIG. 2 shows a traditional software architecture for the software in work station 110. The software is divided into elements that are used at test development and analysis time and software used at test execution time.

A first step in defining the test is generally to specify device data. FIG. 2 shows device data development tools 210. Traditionally, these tools have taken data about a particular device to be tested and stored it in a database that has been custom developed for the tester. This information defines such things as pin groups and time sets. Semiconductor devices have many device leads. Often, these leads operate together in groups. For example, a group might represent an address bus or a data bus. Thus, one tool allows groups of leads to be specified. Another tool allows a correlation between specific leads on the device and pins on the tester to be specified. In some instances, a specific piece of data might be defined by an equation relating that value to other data values. However, in the prior art, equation handling capabilities has been limited.

Other tools allow the timing of signals to be specified. Each pin 124 can generate or measure signals defined relative to timing "edges." There is a set of timing edges for each pin. Each edge can occur once for each vector executed. The time at which each edge occurs can be programmed. A programmed time for each edge for each pin represents one set of timing data. As the desired programming might be different in different bursts or even within the same burst, multiple time sets are usually specified. Each time set must be entered and stored. This information has been traditionally entered through a custom data base program designed for a specific tester. The information entered through the custom data base are stored in device data files 214.

Another type of information that must be entered is the specific steps that must be performed for one test. This information is specified in test template 220. A template is a set of steps described independently of the values of any specific device data file. The test templates have been recorded as data files in a format defined for the specific test system. These files are generally provided by the tester manufacturer and are typically written in a programming language, such as the C programming language, that is known for fast execution speeds. In some instances, a test engineer will customize the test templates.

The test templates are compiled by compiler 250. It is conventionally believed that compiled programs execute more quickly than interpreted programs. Because of the speed of execution requirements in testers, compiled test programs have been preferred.

Custom flow tools 218 also allow the order of tests to be specified. The flow is recorded as the program flow 222. Traditionally, the flow is specified as a series of entries in a table, but could also be in a special programming language that resembles a traditional programming language.

To specify a step of the flow, a particular test template can be specified along with the device data file that is to be used for that step. Some of the templates will specify a burst to be executed. Other templates will specify that results of tests be read from the hardware inside tester 112 or that the hardware be setup in a particular way. Other steps in the flow are control statements, such as branching and looping instructions as are found in traditional programming languages.

The program flow serves as an input to custom executive 224. Custom executive 224 fills in the templates specified in the program flow with the data from the device data files 214. This creates a test object.

At test time, custom executive 224 processes the test object and actually controls tester 112. Custom executive 224 sends data and commands to tester 112 through device drivers 228. Because the speed at which custom executive 224 operates will play a large role in dictating the overall test time, custom executives have traditionally been written in a programming language, such as the C-language, that gives a programmer many options for specifying, and therefore optimizing, its execution.

Device drivers 228 are program procedures that send and receive information over bus 116 to control the hardware inside tester 112. Because device drivers 228 perform low level hardware control, they are written in a programming language, such as the C-language, that allows such control.

It is highly desirable that every device be tested as quickly as possible. Therefore, it is desirable that the amount of time required to execute each step in the program flow be very short. The actual time that it takes tester 112 or handling device 114 to respond to, or "execute," commands is independent of the software in work station 110. However, the software in work station 110 determines the "overhead," or the amount of time it takes to setup each command. Considerable effort is expended making the execution time of a job very short. Therefore, it is very important that the overhead time also be very short. In prior art systems, this was achieved with a custom executive 224. Custom executive 224 is traditionally written in the C language. The C language is widely recognized as allowing development of an executive that can be designed to operate quickly.

A major problem with preparing custom executive 224 in the C language is that it takes a very long time to write such an executive. The cost could be literally millions of dollars and could take years of effort. Another problem with having a custom executive is that the user interface is also a custom interface. That means that an engineer operating a tester must invest time learning how to program the tester, which is very undesirable to most users. However, heretofore, these disadvantages have been considered necessary in order to have a tester operate quickly.

Another drawback of a custom executive in the C language is that it will likely have a very limited set of user interface capabilities. The user interface is of particular importance for testers, which are operated by people of very different skill levels at different times. During device and test development, the tester is operated by a highly trained engineer. However, once the device and test are developed, the tester is operated by a semi-skilled production worker. Therefore, the user interface must be greatly simplified in the production setting.

Testers traditionally have separate production interface software running on work station 110. The user interface has been traditionally implemented as a menu. The test engineer places on the menu only those commands the operator should need during production testing. The software provided with the tester therefore only provided the capability to create a user interface in the form of a menu. Unfortunately, menus are hierarchical but many operations are not. Therefore, it would be desirable to provide a tester with software that allows a nonhierarchical interface to be quickly and easily developed.

FIG. 2 shows other software elements that are included in work station 110. The vectors loaded into memories 128 (FIG. 1) represent a large amount of data. They are usually developed by software simulators or derived in an automated way. They are not usually entered manually by a user. FIG. 2 shows that vector development tools receive simulation inputs. Vector development tools allow a user to edit the vector files, which are then stored in vector and results files 234. The vector files are loaded into memories 128 prior to a test.

Likewise, where large amounts of data, representing for example measured values at the device under test for numerous successive cycles, have been taken during a test, it might be passed back over bus 116 (FIG. 1).

The vector files 234 can also be accessed by debug and analysis tools 230. Debug and analysis tools are used by an engineer developing a test or developing the part being tested. These tools do such things as display the vectors and results graphically, allow the user to modify the vector file or superimpose expected values on top of measured values. In addition, the debug and analysis tools might allow a user to directly program the hardware in tester 112. They, thus, sometimes call the device drivers 228.

In a typical scenario, device data and development tools 212, test and flow development tools 218, debug and analysis tools and test vector development tools 232 are supplied with a tester. While the device being tested is still being developed, a user uses the device data and development tools 212 to specify the characteristics of the device. Test and flow development tools 218 might also be used to specify some tests to be run on the device.

Sample devices are manufactured. The test programs are run and the debug and analysis tools are used to check out these sample devices. In the process, defects in the sample devices are detected or problems with the program are detected. These problems are corrected and further tests are generated and run.

At the end of the development process, the semiconductor device as well as the test program are transitioned to production. In production, each part is tested as it is manufactured.

SUMMARY OF THE INVENTION

With the foregoing background in mind, it is an object of the invention to provide software for controlling a tester that can be quickly and inexpensively developed.

It also an object to provide software for a tester that a user can easily and quickly learn to use.

The foregoing and other objects are achieved in a tester using commercially available spreadsheet software to develop device data files, test templates and program flow. We have discovered that commercially available spreadsheet software is able to provide all of these functions at the required speed, at a very low cost and, additionally provides the advantages of presenting a standard user interface that users can learn to use without extensive training.

BRIEF DESCRIPTION OF THE DRAWINGS

The invention will be better understood by reference to the following more detailed description and accompanying drawings in which

FIG. 3 is software block diagram of software according to the invention;

DESCRIPTION OF THE PREFERRED EMBODIMENT

Figure 1:
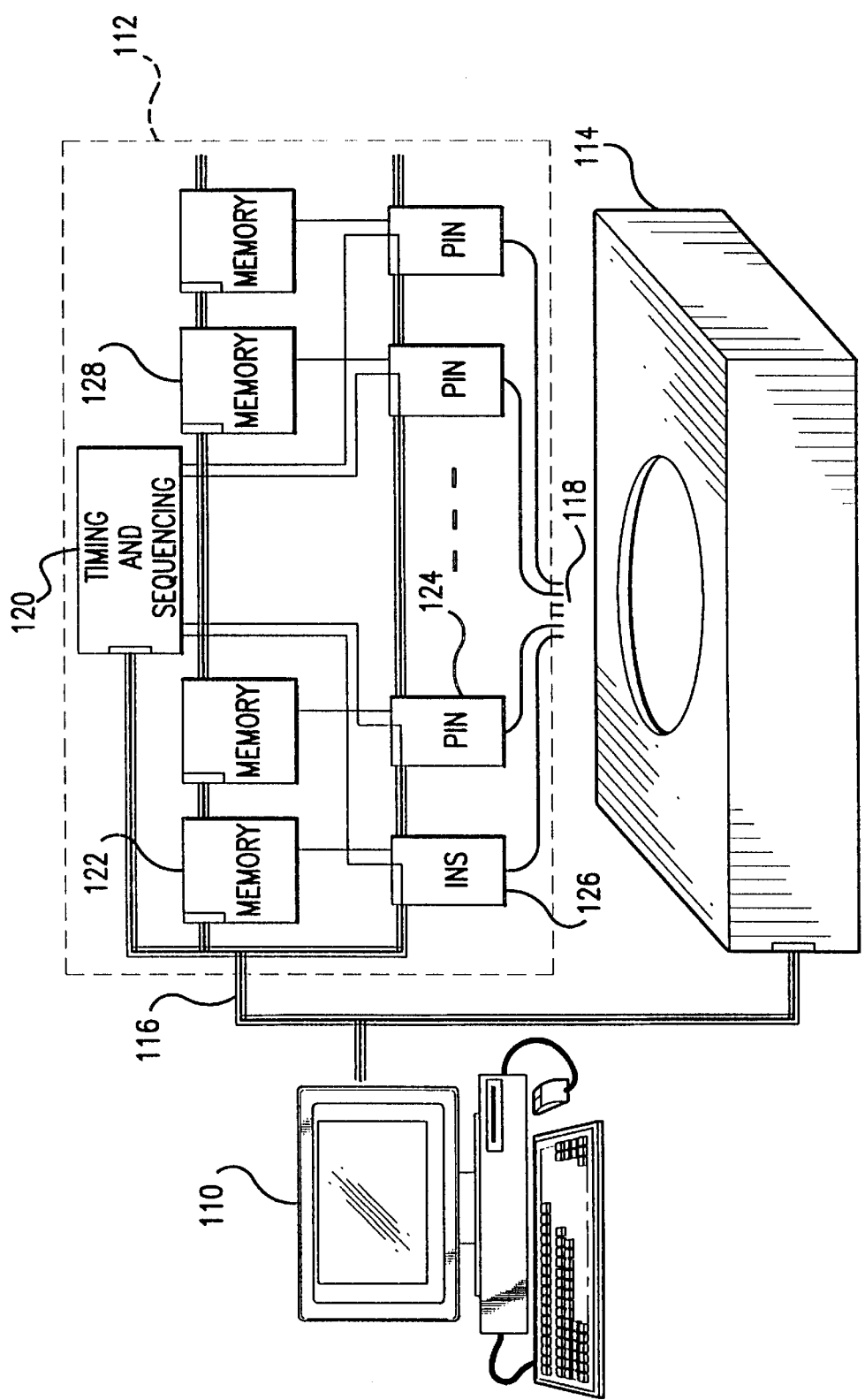
FIG. 1 is a hardware block diagram of a prior art tester.
Figure 2:
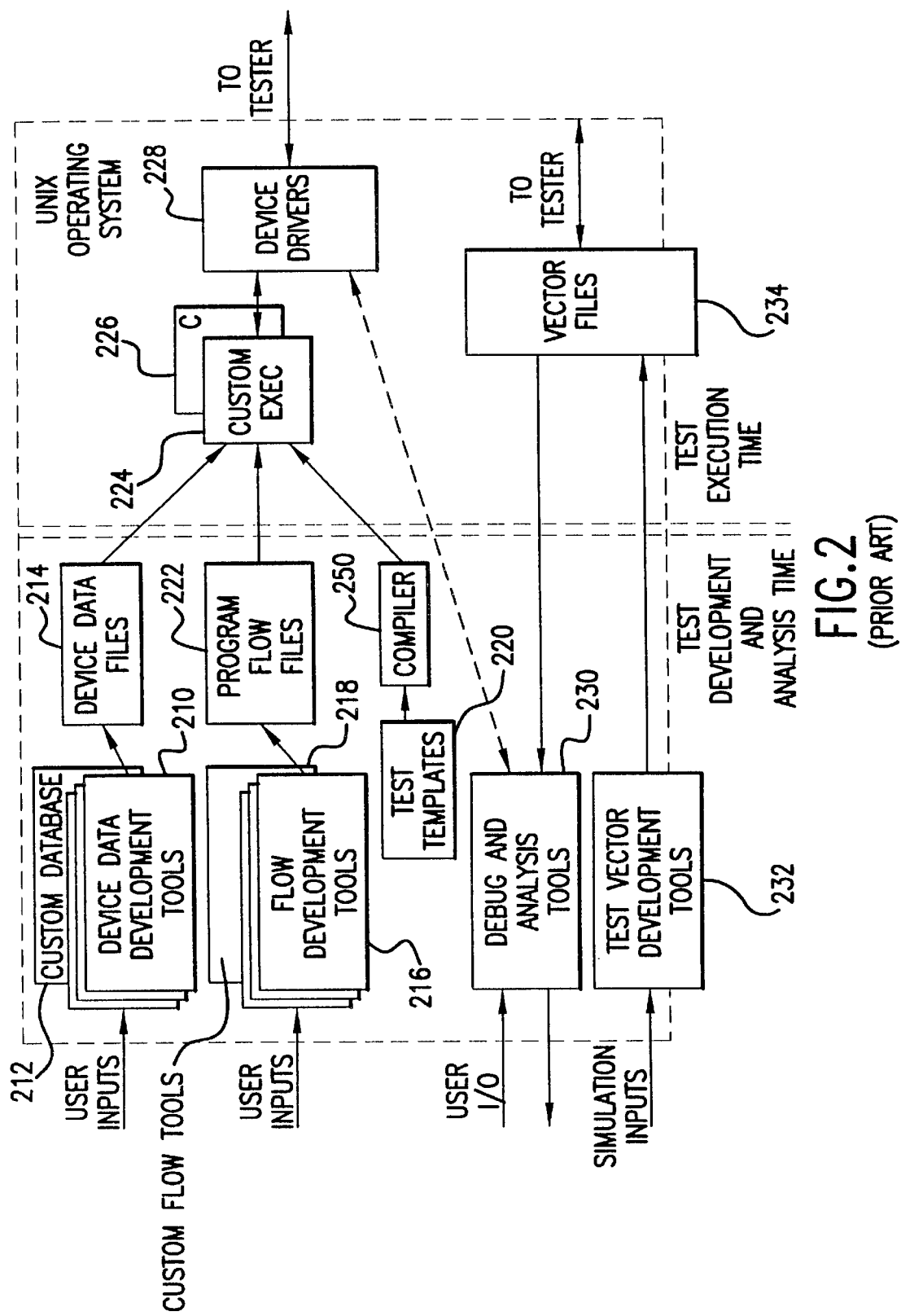
FIG. 2 is a software block diagram of software for a prior art tester.

FIG. 3 shows a unique software architecture that flows from our recognition that most of the functions of custom software in prior art testers can be performed by a commercially available spread sheet program. In the preferred embodiment, EXCEL from Microsoft of Redmond, Wash. is used.

EXCEL is a spreadsheet program that allows a user to create a "workbook." A workbook is a collection of data that is organized into different spread sheets. A spread sheet is simply a grid of cells, each cell holding a piece of data or an equation defining how the data value should be calculated from the values in other cells. The cells appear in an ordered grid. The cells are generally organized so that related data appears in cells that are in a particular row or a particular column. The tools for operating on each of cells are the same, regardless of what the data represents. Within a workbook, any of the spread sheets can be accessed and data in one spread sheet can be used in another.

EXCEL also includes features for defining the spread sheets and developing an "application." EXCEL has been used for applications such as developing accounting systems. The appearance of a spread sheet can be specified, so that a user will see only the cells relating to a particular task. The display can also be tailored in other ways described in the EXCEL Application Developers Guide, and *Using Excel Visual Basic For Applications* by Jeff Webb, published by Que Corporation 1996 ISBN 0-7897-0269-X. each of which is hereby incorporated by reference.

A second way that EXCEL can be used to make an application is through the use of Visual Basic. Visual Basic is a programming language built into EXCEL. As its name suggests, a primary purpose of Visual Basic is to control the appearance of the spread sheets as they are presented to a user to enter data. Visual Basic is generally used to select which of the spread sheets is presented to a user at any given time while an application is being performed. Selections are generally based on data or commands that have been entered by a user so that, while any given task is being performed, the user sees the data that is relevant to that task. Therefore, Visual Basic includes many commands that can be used to control how a running application appears to a user. Visual Basic also includes programming commands that control the program flow, such as conditional statements for branching and looping.

We have discovered that Visual Basic can be used to write test templates as well as to control the execution of tests when used in the workstation of a semiconductor tester. In particular, we have discovered that a commercial spread sheet program, such as Excel, can be customized to assemble a test program from data and test templates so quickly that there is no appreciable loss of speed in executing a test in comparison to a custom executive. With this recognition, we have been able to achieve numerous benefits. Development of such a software application is very rapid. In addition, it is very easy for someone to learn to use that application because most programmers are familiar with commercial spread sheet programs. Moreover, the tester control software can take advantage of the many features built into a custom spread sheet program, such as context sensitive help and editing commands.

FIG. 3 shows device data and flow development tools 310. In the preferred embodiment, these tools are implemented by customizing spread sheets within the Excel workbook. To hold device data, there are spread sheets for: a pin map, the levels of signals to be applied at each pin and the time sets. There could optionally be other spread sheets for data such as: a channel map, specification of various constant values and edge sets. There can be multiple spread sheets of each type because different data values are needed for different kinds of tests. Each spread sheet is called a "data set." Spread sheets for device data used in a preferred embodiment are illustrated in conjunction with FIGS. 4 through 9 below.

Test flow is also represented as a spread sheet within the workbook. Test flow is specified by a series of steps that are executed. There is data associated with each step and each step is represented as one row in a spread sheet. The exact operation performed at each step could be influenced by the state of one or more flags. Execution of a step could cause the state of some of these flags to be altered. In this, branching or other similar control constructs might be achieved.

One of the pieces of data that is specified for certain steps in the flow is which test template is to be used with which data set. A test template and the data sets to use with that test template is called an "instance." Instances can be described also as a spread sheet. Spread sheets for flow information used in a preferred embodiment are illustrated in conjunction with FIGS. 10 through 11, below.

The structure of each of the spread sheets is defined by the software in workstation 110. The structure of each spread sheet is created by specifying a template using well known mechanisms of the commercial spread sheet program. The data values for each of the spread sheets is filled in by a test engineer and their values will depend on the type of device being tested.

The tester control software according to the invention will employ debug and analysis tools and test vector development tools as in the prior art. These items are not shown in FIG. 3 for simplicity. In the preferred embodiment, the vector files are too large to be easily handled in a commercial spread sheet program. For that reason, they are not implemented in Excel.

Figure 4A:
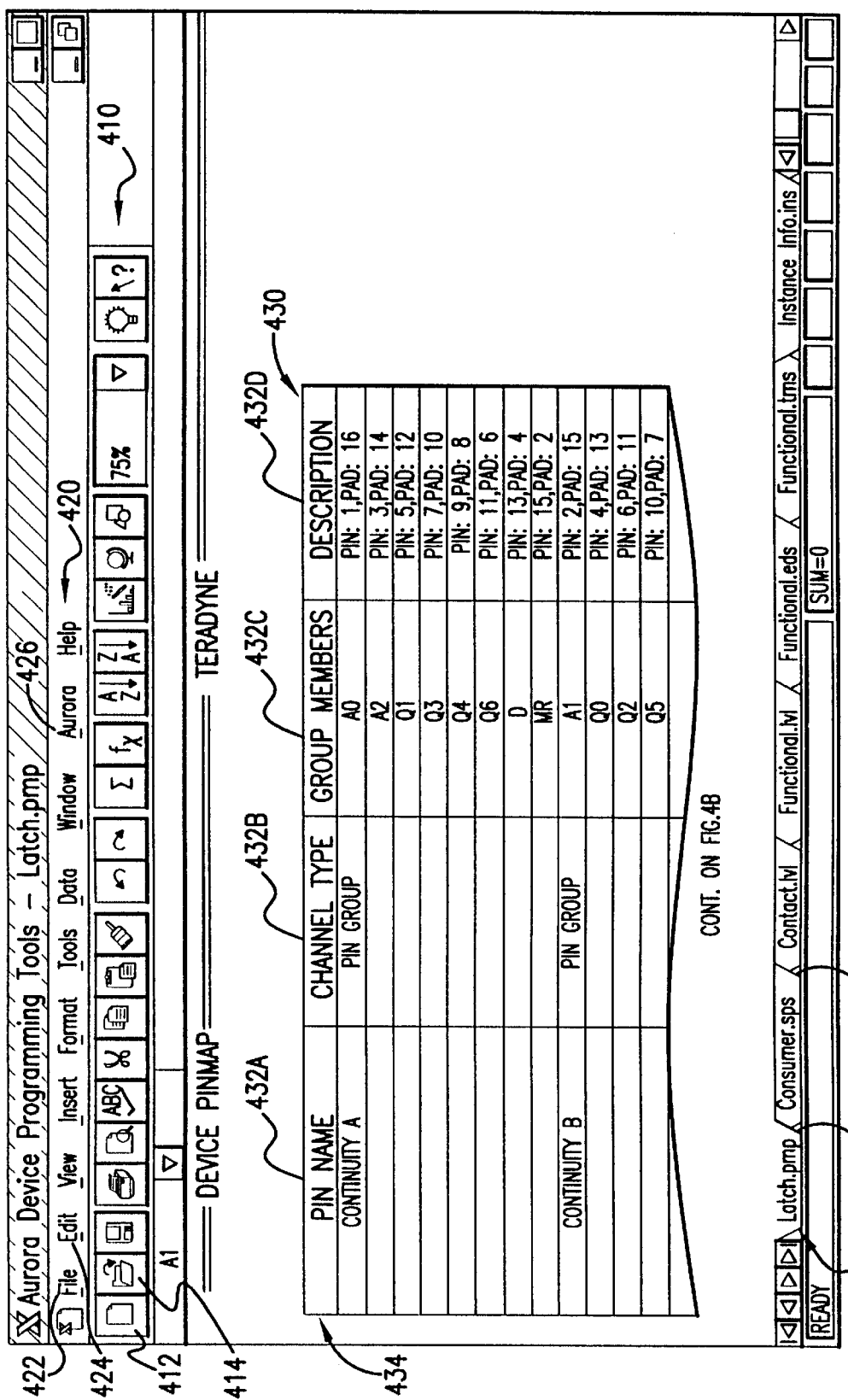
FIGS. 4 through 9 illustrate device data sheets for use with the invention.
Figure 4B:
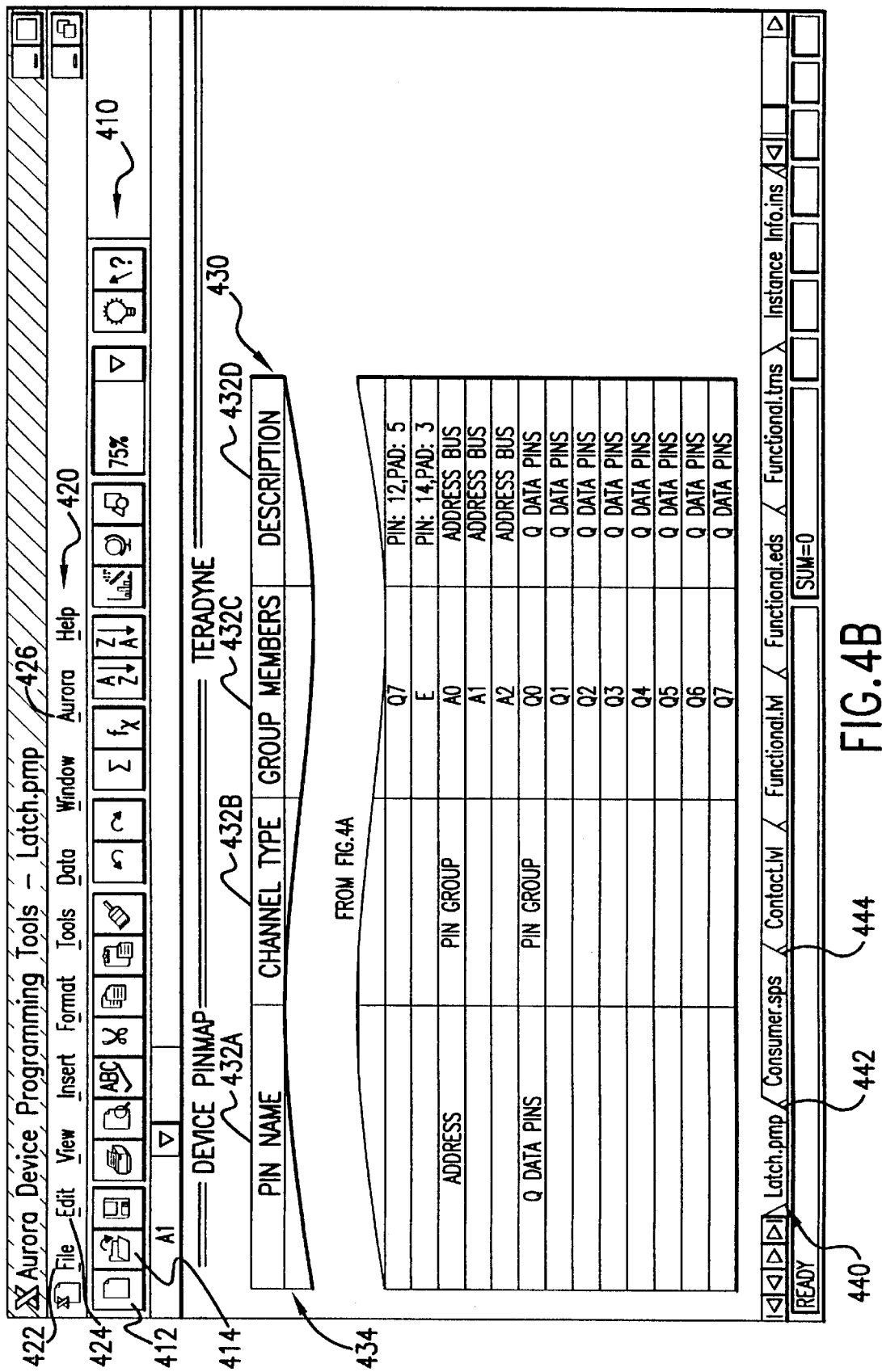

Turning to FIG. 4, the display on work station 110 while a pinmap device data sheet is being accessed is shown. FIG. 4 represents one window. The window is displayed by Excel software on work station 110. Because the Excel software is controlled by a Windows® NT (a trademark of Microsoft Corporation) operating system, multiple windows can be displayed on the screen at one time.

Each window contains certain fields. Field 410 is known as a tool bar. Field 420 is known as a menu bar. Field 430 is the data cell field. Field 440 is the tab field. The content of these fields is, in many instances, specified as part of preparing the software to control work station 110. However, the placement and general operation of each of these fields is standard for all applications developed using Excel. Thus, even though according to the invention, Excel is used to control a semiconductor test system, people familiar with Excel or other Excel applications will understand in general how to use the software. Thus, the invention provides a tremendous time and cost savings in comparison to a custom software system because it is so easy to use.

Tool bar 410 contains numerous tool icons, such as tool icons 412 and 414. As will be described in greater detail below, the test program for tester 112 will be largely specified by filling in data in various spread sheets. Despite the fact that the data represents control information for a semiconductor tester as opposed to financial or other types of data for which a commercial spread sheet program is normally used, the data must be manipulated in the same way. Thus, data manipulation tools are needed, but can be the standard data manipulation tools used with Excel. These tools perform such functions as copying data, deleting data or saving the spread sheet to a computer file. These tools are accessed by the user manipulating an input device, such as a mouse or a track ball, to select a specific tool icon.

In addition, field 410 can be customized with custom tools. Excel allows custom tools to be specified and added to a tool bar. If desired, custom tools that perform functions unique to the generation of test programs could be added to tool bar 410. For example, some custom tools might execute test programs while others check device data for errors or inconsistencies.

Menu bar 420 includes system menu items, such as 422 and 424. These items, when accessed by a user, expand to provide multiple choices of actions related to the system menu item. For example, under the FILE system menu item, there are choices such as save, delete or print. There is some overlap between the tools that can be accessed from tool bar 410 and menu bar 420. In general, the most common tools appear on tool bar 410 and are often duplicated as one of the choices under one of the system menu items.

Most of the menu items represent functions that are not specific to data used for automatic test systems. Therefore, system menu items provided as a default condition for Excel applications can be used for most of the menu items. There are, however, many functions that are specific to automatic test systems. In the preferred embodiment, these functions are executed by a user selecting choices from custom menu item 426. Excel may be customized for applications in accordance with instructions provided in the above mentioned Excel applications development guide. The custom menu choices could appear on the same menu bar as the system menu items or on a separate custom menu bar.

For data sheets that contain device data, the custom menu items enable the data sheet to be "validated." As described above, the various cells in a data sheet can have associated with them data validation functions. These data validation functions can detect improper data values in the context of the current data sheet. For example, if a particular field is intended to hold a numeric value, an error can be detected if the input value contains letters. Other cells might be limited to only positive values and an error is indicated if the input value is negative. However, some validation functions depend on multiple sheets. For example, the total number of pins might be specified on one sheet and certain attributes might be specified for each pin on another sheet. If attributes have been specified for too few pins, this can only be detected by comparing the two sheets. Various validation functions can be defined based on the requirements and limitations of the tester hardware. These validation functions can be selected from the custom menu items. Alternatively, the same functions could be selected using toolbar buttons.

In addition, for flow data sheets, it is required that there be a way to execute the tests defined by the flow. Custom menu items associated with flow sheets cause the flow to be executed and also the manner of execution. For example, it might be desirable to set break points in the execution of the flow or to run the flow one step at a time. Each of these functions might be specified as a menu choice from the custom menu or toolbar buttons.

The custom menu items can be different for each of the sheets. Excel allows that certain attributes be specified for each data sheet. One of those attributes is the custom menu items. In this way, the custom menu can be tailored to include only those operations that are appropriate for the specific type of data displayed in a particular sheet. Hereinafter, other operations are described that are performed by the software controlling tester 112. These operations can be defined as functions that are mapped to menu items that appear on the custom menu.

Data cell field 430 contains data cells that are customized for controlling tester 112. The cell layout is provided by Excel. However, the number of rows and columns visible in the window in dictated by programming Excel. FIG. 4 represents a device pinmap data sheet. Therefore, data cell field 430 contains rows and columns of cells that are laid out to receive device pinmap data.

In a semiconductor tester, the device pinmap assigns logical names to the physical pins 118 (FIG. 1) based on how those pins 118 contact a device under test while a test program is executing. Data cell field 430 is shown with four columns of data cells 432A . . . 432D. Each of the columns is headed by a cell, such as header cell 434. Header cell 434 contains a description of the type of data that is to be filled in the remaining cells of that column. When a spread sheet is defined in Excel, certain cells can be given a fixed value, such as the header cells.

Rules for entering and checking data are not visible in FIG. 4. However, one feature of a commercial spread sheet program is that data can be validated as it is entered in various cells. Alternatively, some data cells can be computed based on the values entered in other cells. Commercial spread sheets were developed with this feature, such as for entering large amounts of financial data. Nonetheless, even when the data is used for controlling a tester, some data entry rules will be possible and can be used.

A further field in FIG. 4 is tab field 440. Tab field 440 contains a series of tabs, such as 442 and 444. Each tab represents one spread sheet that is within the workbook that contains the test program. A user selects which spread sheet is active by activating one of the tabs. In the illustration of FIG. 4, tab 443 bearing the name pinmap.pmp is on top of the other tabs, This is the selected tab, corresponding to the pin map spread sheet shows in FIG. 4.

Tab field 440 illustrates an important advantage of setting up all the device data as one work book. In contrast with prior art testers in which different types of data was entered into different tools, all device data is entered into one Excel workbook. Having all the data in one workbook allows data values in one spread sheet to depend on data entered into a different spread sheet. In addition, it allows a person developing a test program to quickly switch between the sheets for different types of data. While each of these operations might have been possible if a custom programming environment for a tester were developed properly, this simplicity is achieved at relatively low cost and without the complexity of passing data from one programming tool to another. Further, it is implemented in a fashion that is conceptually easy for a programmer to quickly understand.

Figure 5:
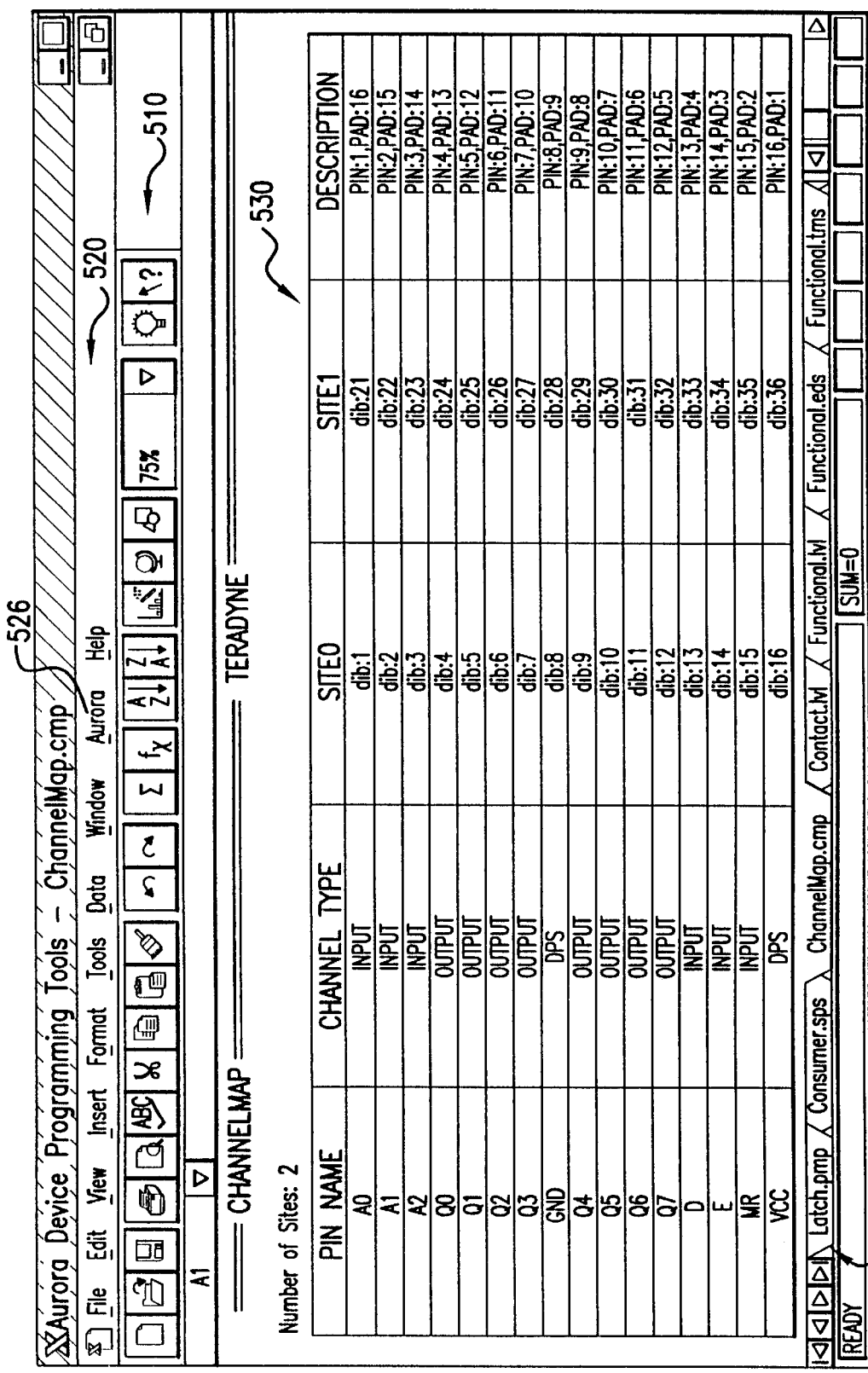

Turning to FIG. 5, a second device data spread sheet is shown. FIG. 5 shows a window on the screen of work station 110 as it would appear while channel map data is being entered. It is important to note that, though channel map data is different than pin map data, the screen displays in FIG. 4 and FIG. 5 are very similar.

The screen display in FIG. 5 has the same fields as in FIG. 4. Tool bar 510 is the same as tool bar 410. Menu bar 520 is the same as menu bar 420. It is possible that some menu items in menu bar 510 will differ from items in menu bar 410. Such would be the case if certain functions were applicable, for example, only to channel map data. In that case, menu items, or sub-menu items, for those functions would appear on menu bar 510 only. In the preferred embodiment, those functions that are dependent on the type of tester data in the spread sheet being displayed will appear as sub-menu items under custom menu item 526. Alternatively, the data dependent functions can be accessed through custom tool bar items.

It is preferable that the commercially available spread sheet used to implement the software for the tester include features that allow different types of data sheets to be defined and also to allow the sub-menu items that are displayed to depend on the type of data sheet used.

Note in tab field 540 that each tab has a two part name on it. The first part is an identifier for the spread sheet. The second part of the name, or the extension, is the type of spread sheet. For example, FIG. 5 shows a tab labeled ChannelMap.cmp. All spread sheets holding data which is the type that defines a channel map will have the ".cmp" extension. However, a test engineer selects the specific identifier. In a preferred embodiment, the commercially available spread sheet program running on work station 110 allows an application developer to specify which menu items and sub-menu items appear on menu bar 420 for spread sheets of that type.

Figure 6:
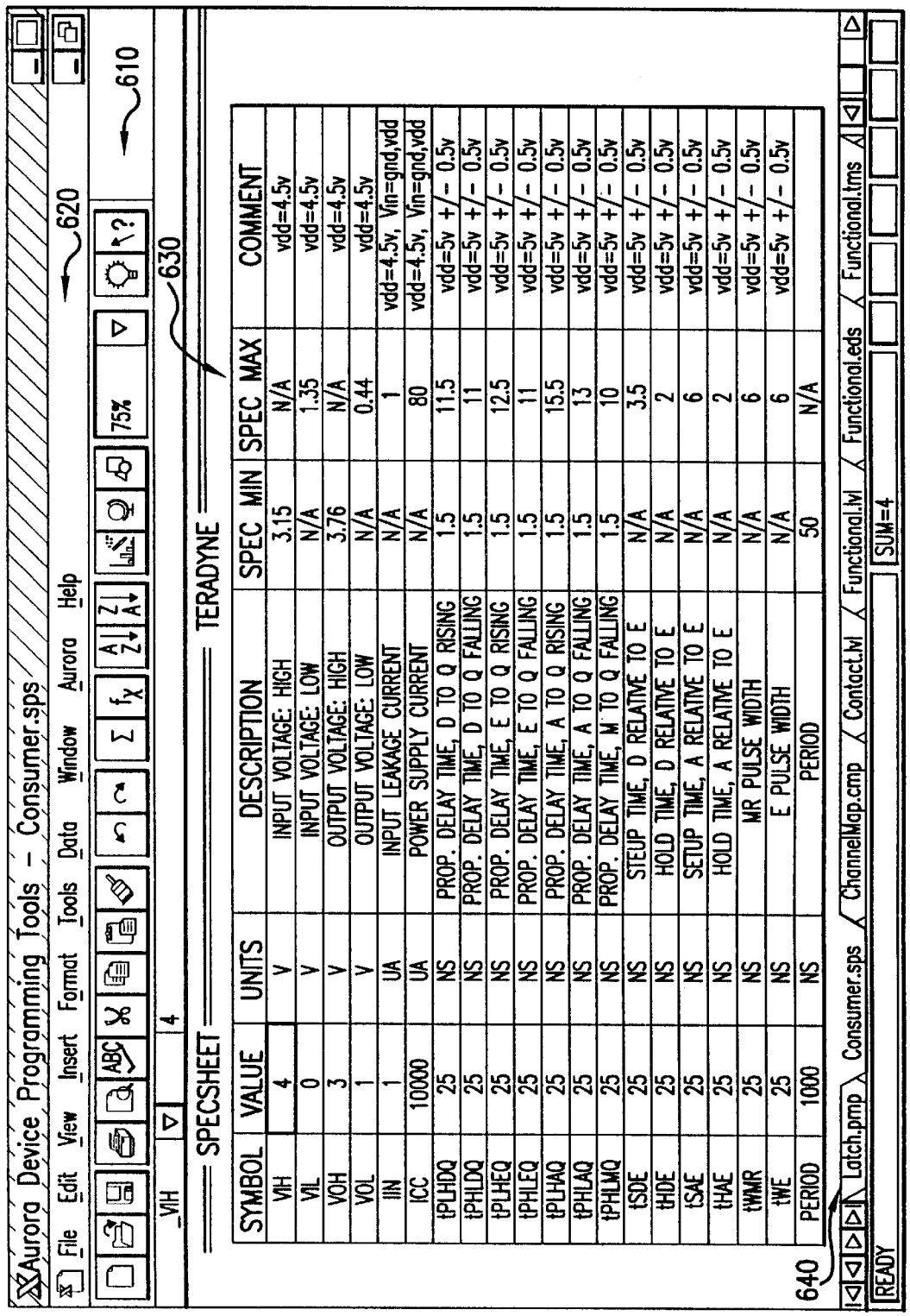

Turning now to FIG. 6, a spread sheet for a spec sheet is shown. As with all the other data tools, this spread sheet has a tool bar 610, and a menu bar 620 and a tab field 640. Tab field 640 is shown with the current spread sheet, labeled "SpecSheet.sps", highlighted. Likewise, the SpecSheet has a data field 630 with many data cells organized into rows and columns. Here, each row contains a symbol for a parameter associated with a particular device under test. Various information is given for each parameter. FIG. 6 shows 7 columns in each row of data field 630. In addition to the symbol name, each row includes a value, units for that value, a text field for a description of the symbol, minimum and maximum values for a properly operating part and a comment field. Because the data sheets are all developed in a single Excel workbook, these symbols can be referred to by name in the other spread sheets. More importantly, the parameters associated with each symbol can also be used in other spread sheets. Additionally, the name of the Spec Sheet can be passed as a parameter to a specific test template as a test instance is being developed. This allows the test template to make comparisons to the Spec Sheet data, such as to determine whether the device being tested is operating within specification (i.e. it passed or failed the test).

FIG. 6 shows a single specification sheet. It is possible that different specifications are required for different types of tests within a single job. Therefore, multiple specification sheets could be used. As will be described below in conjunction with Data Manager 316, provisions are made for having multiple sets of data of a particular type.

Figure 7:
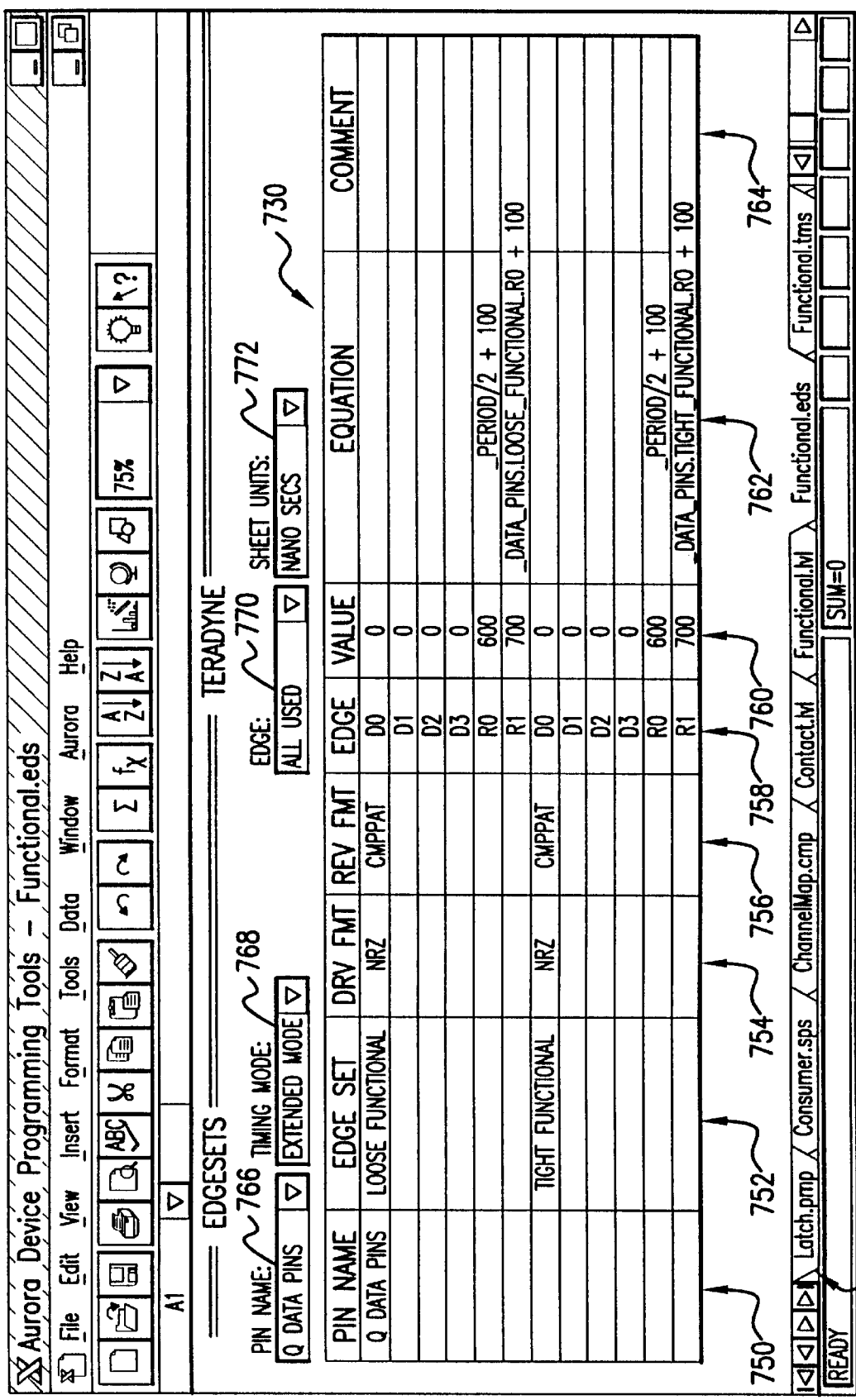

FIG. 7 shows a further device data sheet used for defining edge sets. As shown in FIG. 1, tester 112 includes multiple pins 124. Each pin includes multiple circuits, called edge generators, that each generate an edge. An edge is a signal which is used to time some action by a pin 124. For example, there might be four edge signals that control such parameters as the starting and stopping time of a pulse produced by the pin. The time at which each edge is generated can be programmed. The times at which each edge for one pin are programmed is defined as an edge set. Because the time at which the edges are to be programmed for a particular pin might change during a job, there can be multiple edge sets for each pin.

FIG. 7 shows an edge set for one pin. Column 750 shows that the pin for which the edge set is specified is called "QDataPins". Edge sets for other pins might be added by adding more rows to data field 730. Column 752 shows that one edge set for pin QDataPins is called "LooseFunctions 1". Other edge sets might be defined by adding more rows to data field 730.

Columns 754 and 756 give other information needed to set up the pins 124 to generate a desired signal. Column 758 lists edges within the pin and the adjacent columns 760 and 762 give values for the times at which those edges occur.

Columns 760 and 762 illustrate a useful benefit of controlling tester 112 with a commercially available spread sheet. The spread sheet can automatically calculate a value from an equation. Thus, column 762 allows the time value for each edge to be specified as an equation in relation to other constants or parameters which are defined in other spread sheets. Column 760 shows the numeric value that is either programmed for that field are calculated automatically by the spread sheet program by evaluating the equation in column 762.

Cells 766, 768, 770 and 772 show other advantages that can be obtained by using a commercially available spread sheet program. Drop down list boxes in data field 730 can be used to control the display or values of data cells in the data field 730. Drop down list boxes 766, 768, 770 and 772 are used in this fashion. Those cells are implemented as drop down boxes, which is a standard object in Excel. Each drop down box can have one of a fixed number of values. The values can be specified as a fixed list or by reference to values entered in one of the spread sheets within the workbook, which would then change as the entered values change.

Given the large number of pins in tester 112, an edge set spread sheet might potentially contain many rows. Cells 766, 768, 770 and 772 can be used to restrict the amount of data that is displayed at one time. Cell 766 contains the name of a particular pin or pin group. Only edge sets for that pin or pins within that group are displayed in data field 730. In a similar way, cells 768 and 770 display edge sets for a particular timing mode and for only a selected number of edges. Cell 772 is similarly a drop down box, but is used to specify the units for values that are entered into value column 760.

Figure 8A:
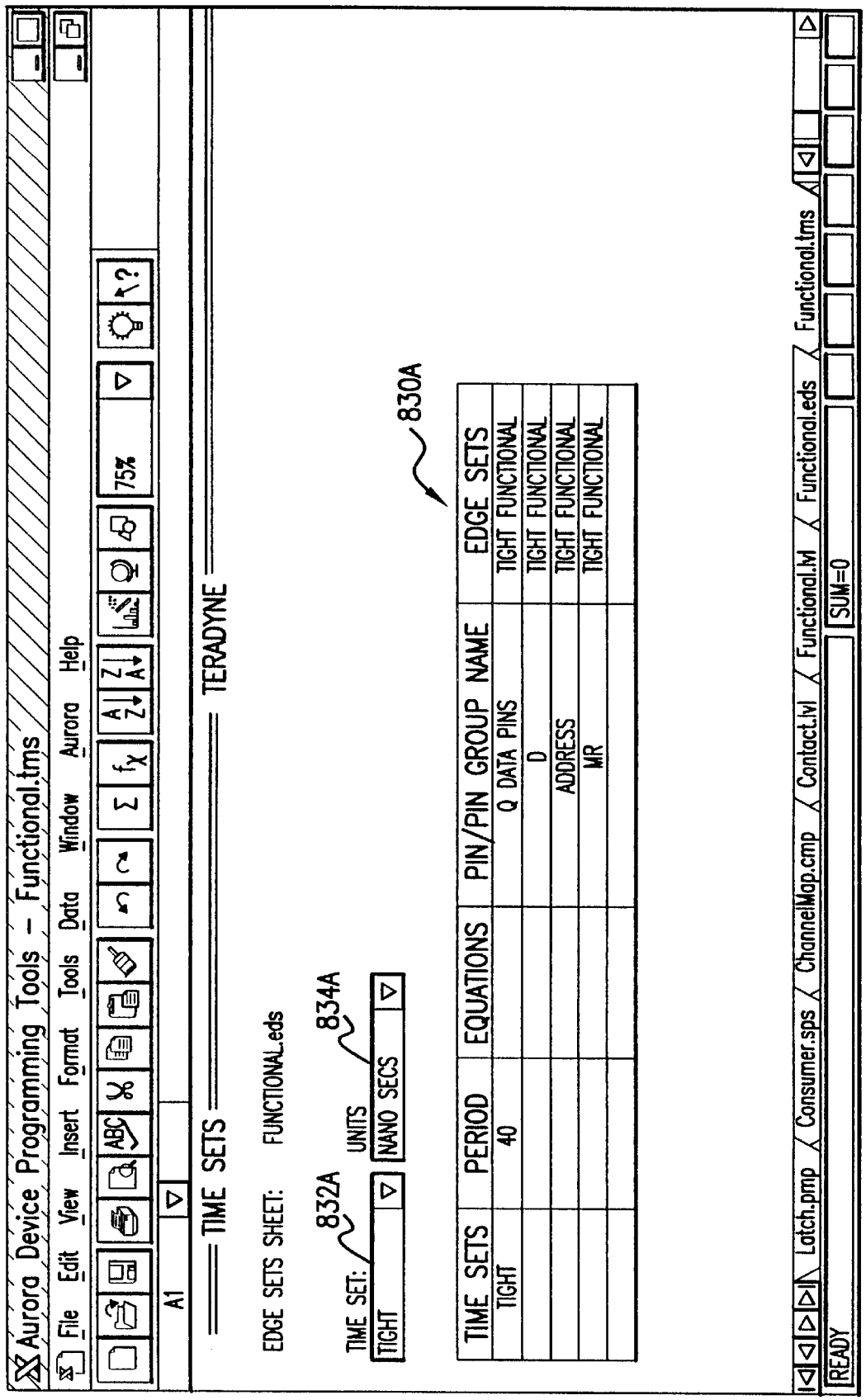

FIG. 8A shows another data sheet within the Excel workbook. The sheet in FIG. 8A gives data for a time set and is in the same format as other data sheets. A time set is a collection of edge sets, one for each of the pins 124. Multiple time sets are often defined so that different programmed times might be used within a job.

FIG. 8A shows columns that allow entry of data on the name of a time set, the period associated with that time set and a pin or pin group. For each pin or pin group, there is one row in the table. For each pin or pin group, there are columns that allow the programmed time for edges of that pin to be specified either by reference to an edge set or to an equation. FIG. 8A also shows drop down boxes 832A and 834A. Drop down box 832A selects which time sets are displayed. Drop down box 834A specifies the units in which all time values are displayed.

Figure 8B:
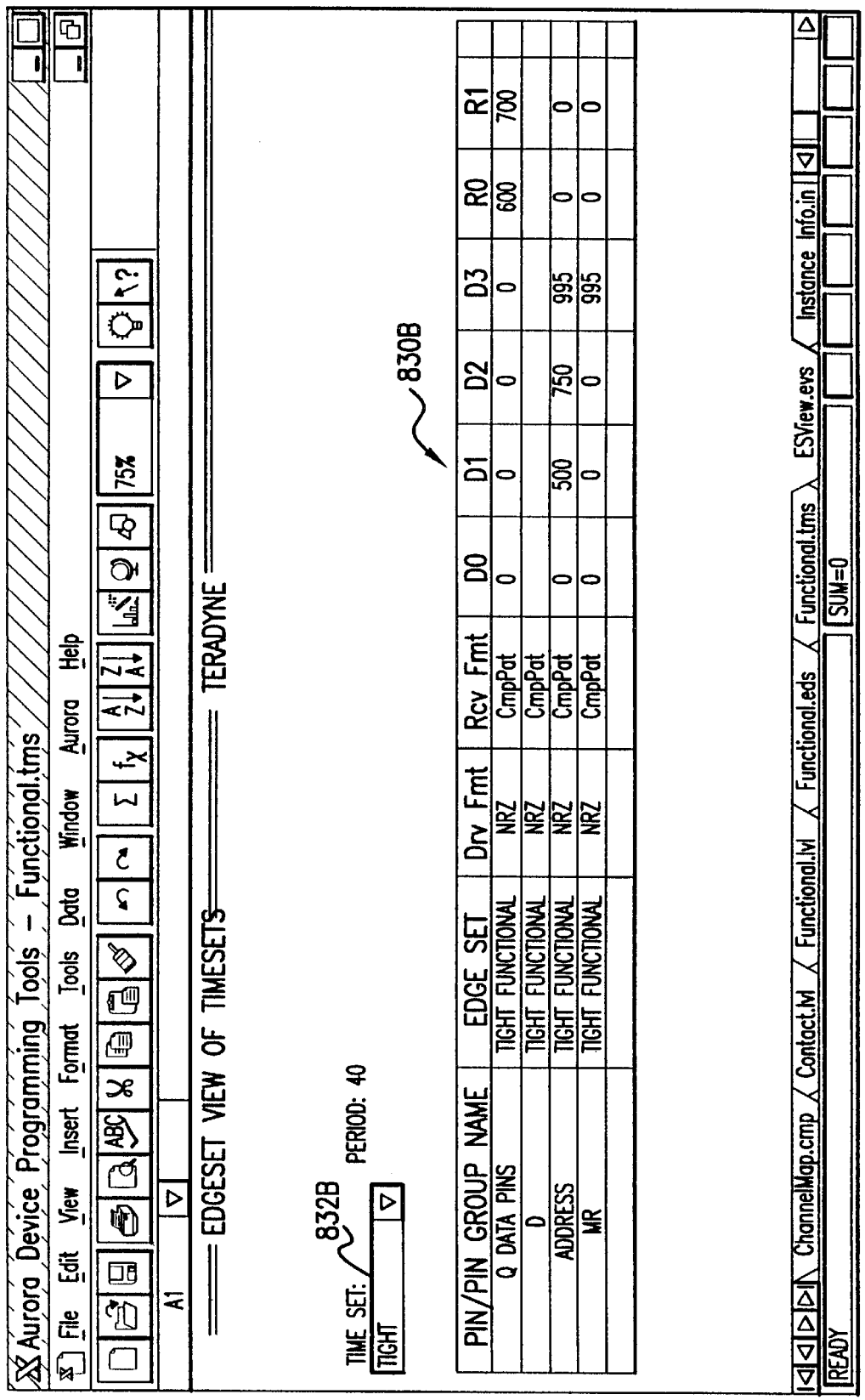

FIG. 8B illustrates another advantage that results from using a commercially available spread sheet program. Multiple spread sheet templates can be defined for the same data. Having multiple templates for the same spread sheet allows the same data to be displayed differently to allow a user to view the data in format which is most useful for whatever task the user is working on. FIG. 8B shows an alternative template for displaying edge set data. It has a drop down box 832B, like drop down box 832A. It also has a data field 830B, similar to data field 830A. However, the columns in data fields 830A and 830B are organized differently.

The template depicted in FIG. 8A might be used, for example, to assign pin groups to specific time sets. The template in FIG. 8B might be used, for example, to determine which edge set each pin has been assigned to. In a preferred embodiment, the template in FIG. 8B might be a read only template.

Figure 9:
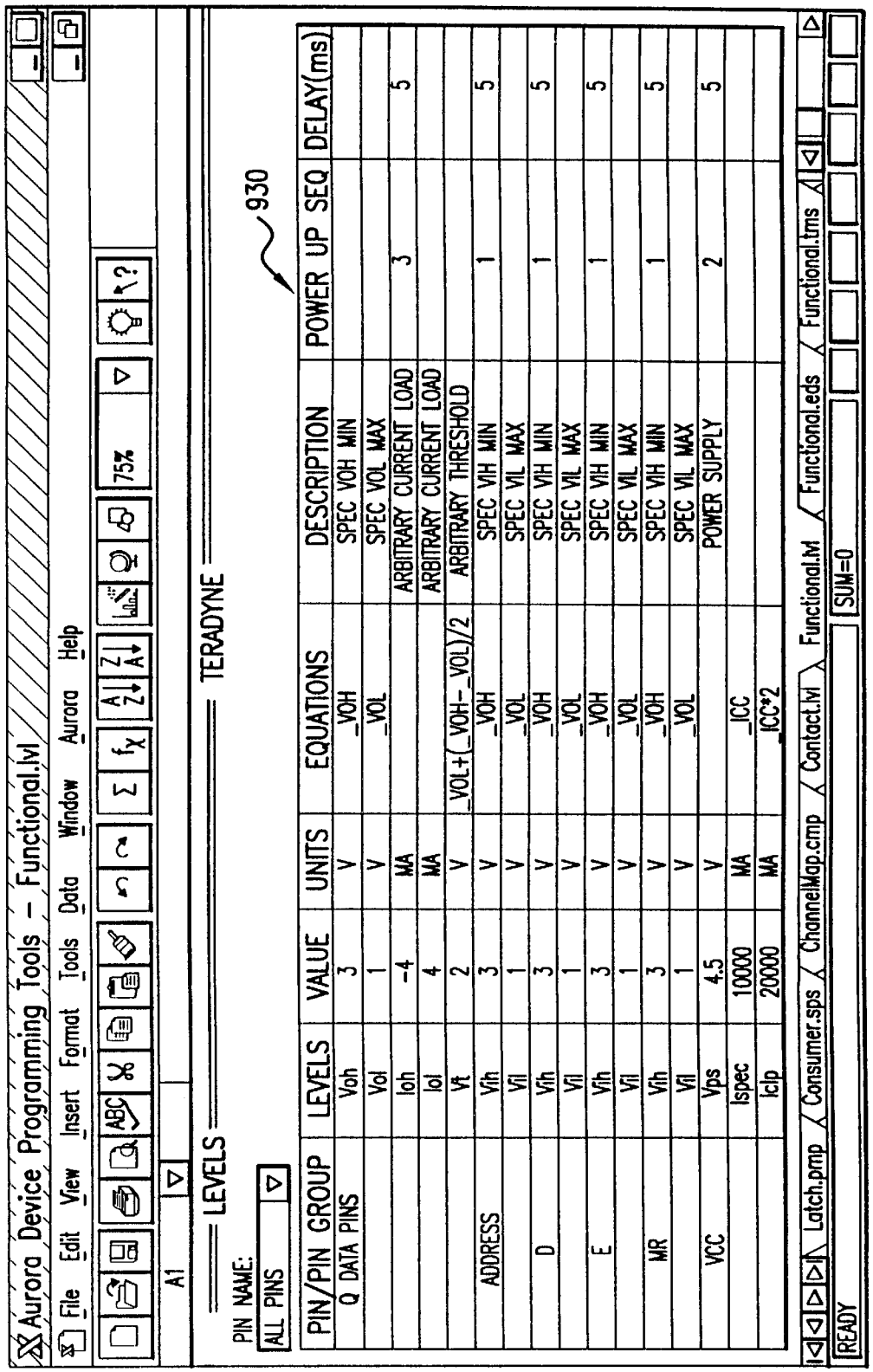

FIG. 9 shows yet another type of data that can be easily entered by a user in a consistent format. Note that FIG. 9 shows the same tool bar and menu bar as are used for other spread sheets. FIG. 9 shows a spread sheet for specifying levels associated with various named parameters. The parameters are likely voltage and current levels associated with various measurements or stimulus signals. Excel allows these named parameters to be referenced by name in other spread sheets. It also allows values of the parameters to be specified by an equation incorporating other named values.

Figure 10A:
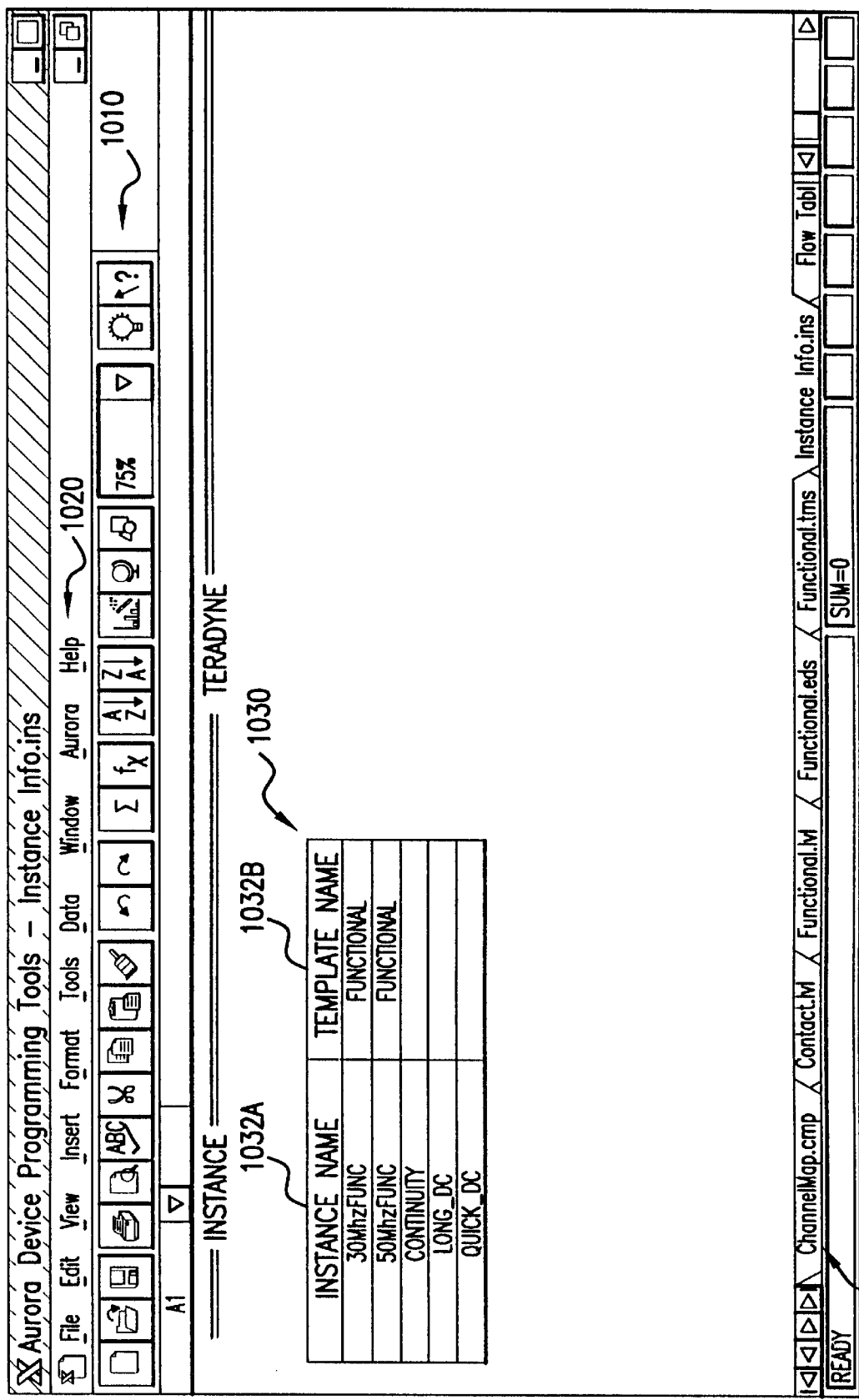
FIGS. 10 and 11 illustrate flow data sheets for use with the invention.

Turning to FIG. 10A, one of the advantages of the invention can be observed. FIG. 10A represents a "flow type" spread sheet. FIG. 10A represents the manner in which test "instances" are defined for a particular test. A semiconductor test system is generally needed to test for a limited number of things. For example, the test system might run a pattern "burst". During a burst, the tester applies specified stimulus and checks for certain expected responses. The values for the stimulus and responses are specified in a "vector file". Different values in the vector file are used to test different kinds of parts or to run different tests on the same part. However, the operations that the tester goes through to use a vector file are generally the same, regardless of the specific data values in it.

The series of steps that the test system must go through to run a pattern burst are coded as a "template." A template is a series of steps that must be performed with the programming equivalent of blank spaces for a description of the specific vector file or other data that is needed. In this way, the template can be used for any test once the specific data values it is to use are specified. Once data has been specified for use with a specific template, an "instance" of the template has been created. The instance can be used in the program.

A tester manufacturer generally provides several test templates as part of its control software. The test templates might be used for running a pattern burst or for making a leakage current measurement, checking DC levels on the leads of a device under test or other tester operations. As will be described in greater detail below, the templates of the preferred embodiment are written in Visual Basic, which is a programming language associated with Excel spread sheet program. Each template is written as a Visual Basic procedure and data values are specified as arguments to the procedure.

FIG. 10A illustrates the way in which program instances are created. Data field 1030 contains a column 1032A for listing the name of the instances that might be used in a test job. Column 1032B contains the name of the template that is used to create the instance.

Figure 10B:
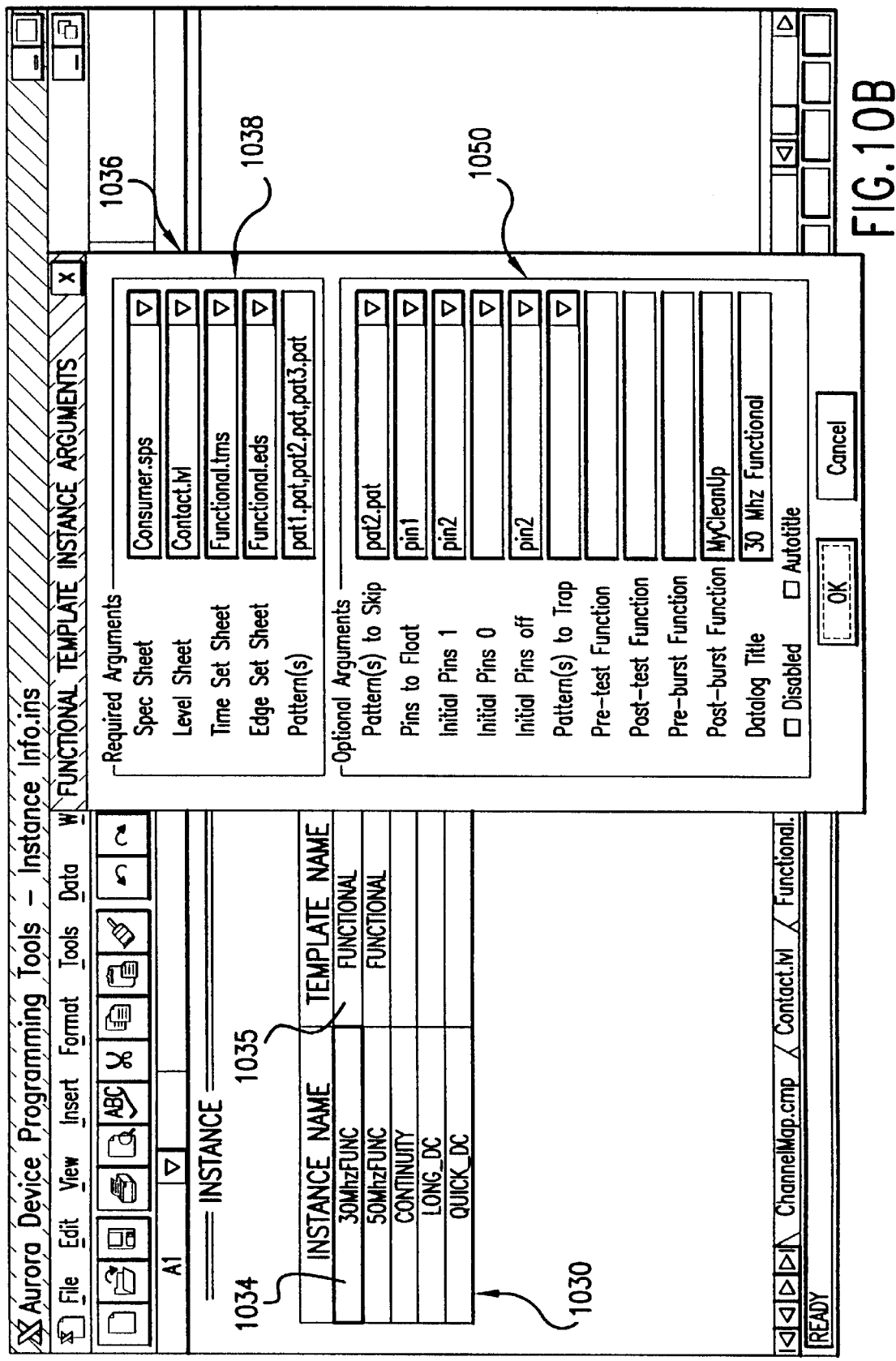

FIG. 10B shows how specific data is associated with a template. Excel includes a programming feature that allows a dialog box 1036 to be associated with a specific cell in data field 1030. A different dialog box can be selected depending on the value in the cell or some other cell. For example, in FIG. 10B, dialog box 1036 is shown associated with cell 1034. Cell 1034 is the name of an instance that is to created by associating specific data values with the template listed in cell 1035. In this example, the format of dialog box 1036 is selected based on the template listed in cell 1035.

Dialog box 1036 contains regions 1038 and 1050, each with fields in which certain data values to be associated the template in cell 1035 are listed. Region 1038 contains required fields. Region 1050 contains optional fields. To create the test instance labeled "30Mhzfunc", the values in dialog box 1036 are passed as arguments to the template named "functional."

FIG. 10B shows that data field 1030 contains many rows. There is one row for each test instance that is needed in the test job. Note that the template named "functional" is used to create two different instances. Different instances are created with the same template by specifying different arguments in the dialog box 1036.

FIG. 10A and 10B are showing steps in specifying the test flow. However, note that the user interface is the same as the user interface for the data spread sheets of FIGS. 4 through 9. Thus, no special training is required to specify the program flow. Note also that the arguments entered in dialog box 1036 are predominately the names of other spread sheets or values defined within spread sheets. Thus, the device data is easily combined with the program flow information, considerably saving on software development time. This benefit flows from the fact that both device data and the program flow are represented in spread sheets.

Figure 11A:
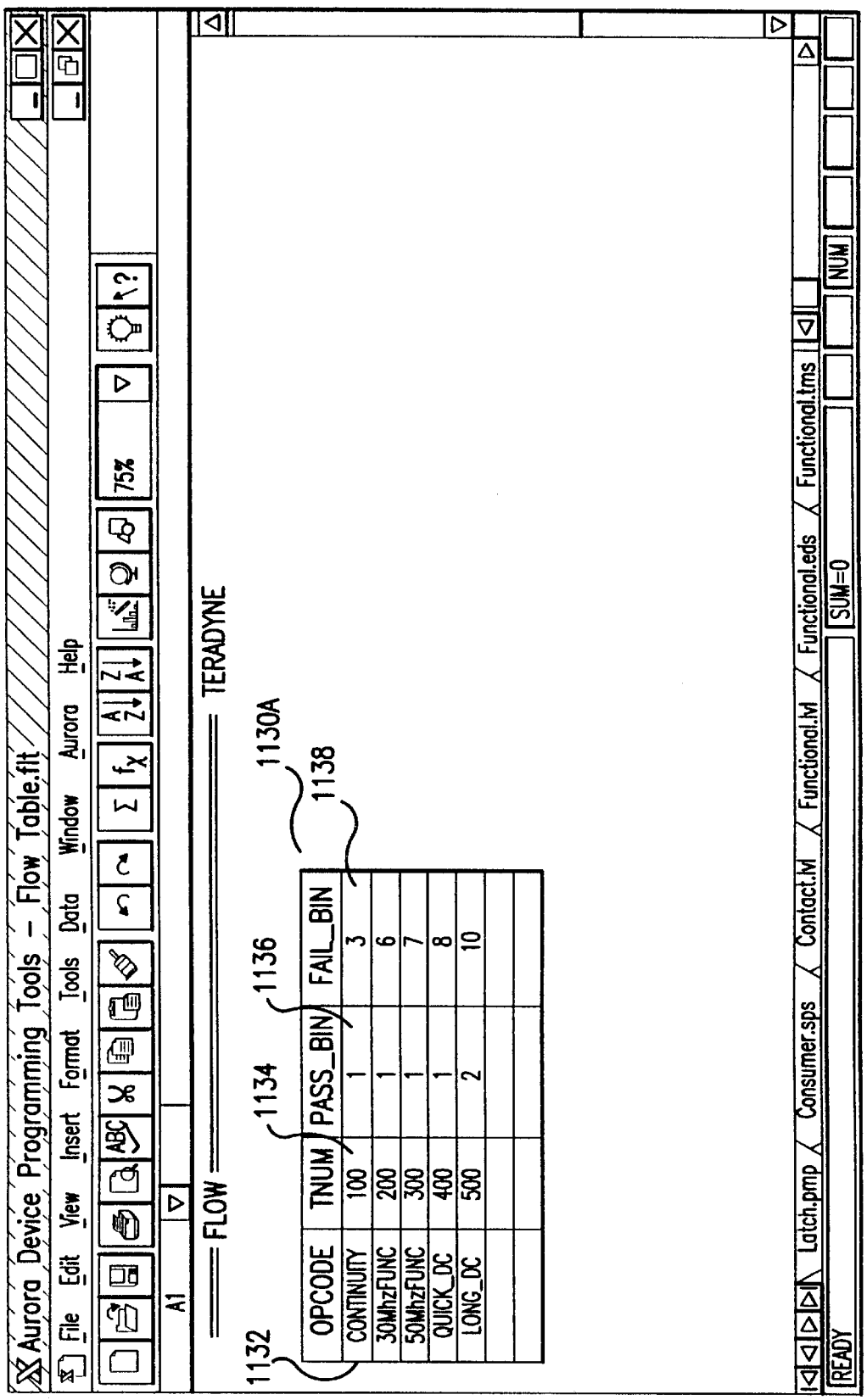

Other program flow information is entered into a spread sheet depicted in FIG. 11A. Once the instances are defined, the order in which they are executed must be specified. In addition, because the instances describe tests within a test job, information must also be provided on what events occur if a test instance passes or fails. All of this information is entered by a user in a spread sheet using the same interface as the other flow and device data spread sheets.

Within data field 1130 are several columns holding information that must be specified for each step in the test job. Each row in data field 1130 holds information on one step in the test job. Column 132 is labeled "OPCODE". This column indicates what is to happen at the specified step. In general, each entry in OPCODE column 132 is a test instance.

Column 1134 contains a step number in the test. Step numbers can be used by the test system to report on execution of the test. For example, if a defect is detected during a test, the step number at which the defect was detected might be reported.

Column 1136 contains a pass bin number. As each device is tested, a tester generally assigns the device under test a "bin" number corresponding to the outcome of the test. The bin number indicates a grading of the part. For example, some bin numbers will represent parts operating to the device specification. Other bin numbers might indicate parts that are so defective as to be useless. Yet other bin numbers might indicate devices that do not perform within the specification but are functional enough to operate to a reduced specification. The test engineer assigns the bin numbers and their significance.

Column 1138 is similar. It contains a bin number that is assigned if the test fails.

Figure 11B:
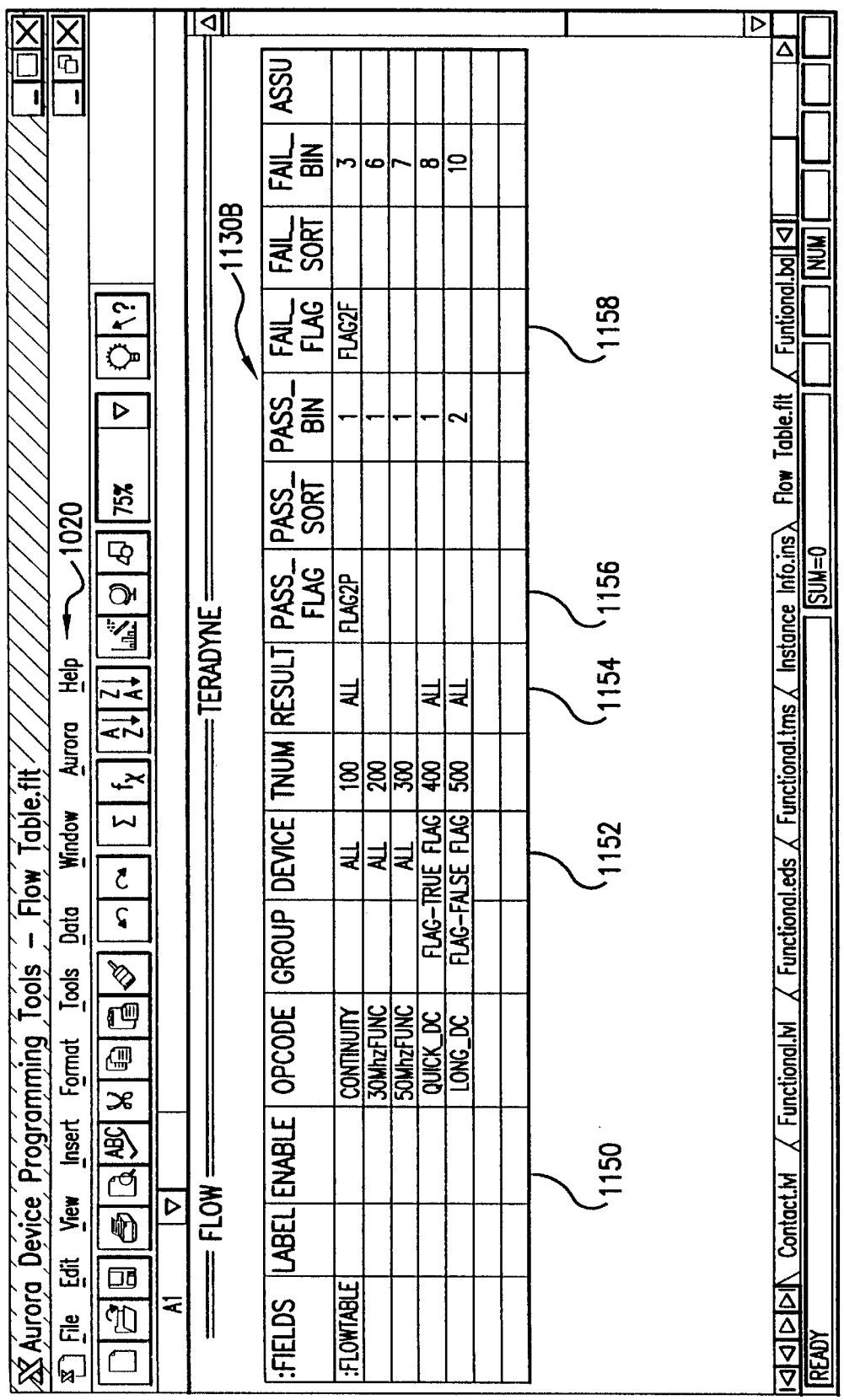

Data field 1130 could contain other columns beyond what are shown. FIG. 11B shows a flow sheet with a data field 1130B expanded with more columns of information for more complicated flow control. For example, data field 1130B contains flag fields 1156 and 1158. Flag field 1156 optionally contains the same of flag, or boolean variable, that is set to "true" if the test specified at a step passes. Field 1158 is similar, but it contains the name of a flag that is set if the test fails.

Other columns in data field 1130B might be used for more complicated flows in the even that multiple devices are tested simultaneously. For example, column 1152 indicates which of the devices the step specified in any row might apply to. A particular test might be applied to all of the devices. Other tests might be run only on the devices that have passed all previous tests. Other tests might be run only on devices that have failed a prior test.

Column 1154 specifies which devices the results of the test are to be applied to.

Columns other than those shown might also be used. There might be a column containing condition fields that are evaluated to a boolean expression prior to the execution of the test instance in that step. In this way, conditional program flows can be implemented. This function might be combined with Column 1152 by allowing it to accept boolean expressions. A boolean expression that evaluates to true would indicate that the test would be performed on all devices. Conversely, if the expression evaluated to false, the test would not be performed on any devices. Hybrid situations would also be possible if a boolean expression could be specified for each device. In the example of FIG. 11B, column 1152 includes some values that have a constant value of "all". Such a value indicates that the test referenced in that row is to be performed on all devices unconditionally. Other rows, however, show boolean expressions that reference flags listed in columns 1154 or 1158 in prior rows. Additionally, it might contain a column in which the cell could be set to a certain value to act like a debugging break point.

The information shown in FIG. 11B is similar to that which must be specified to program an existing tester. However, the flow information of FIG. 11B is organized in rows, with each row containing columns with kinds of information in each column. In comparison to having the flow information stored in a text file, the row and column organization which comes from using a commercially available spread sheet program is much more intuitive for a programmer, thereby enabling the programmer to learn to program a flow more quickly. A second advantage is that the structure and tools for manipulating the flow information shown in FIG. 11B is provided by the commercially available spread sheet program. Thus, development of the software can be done quickly.

Figure 11C:
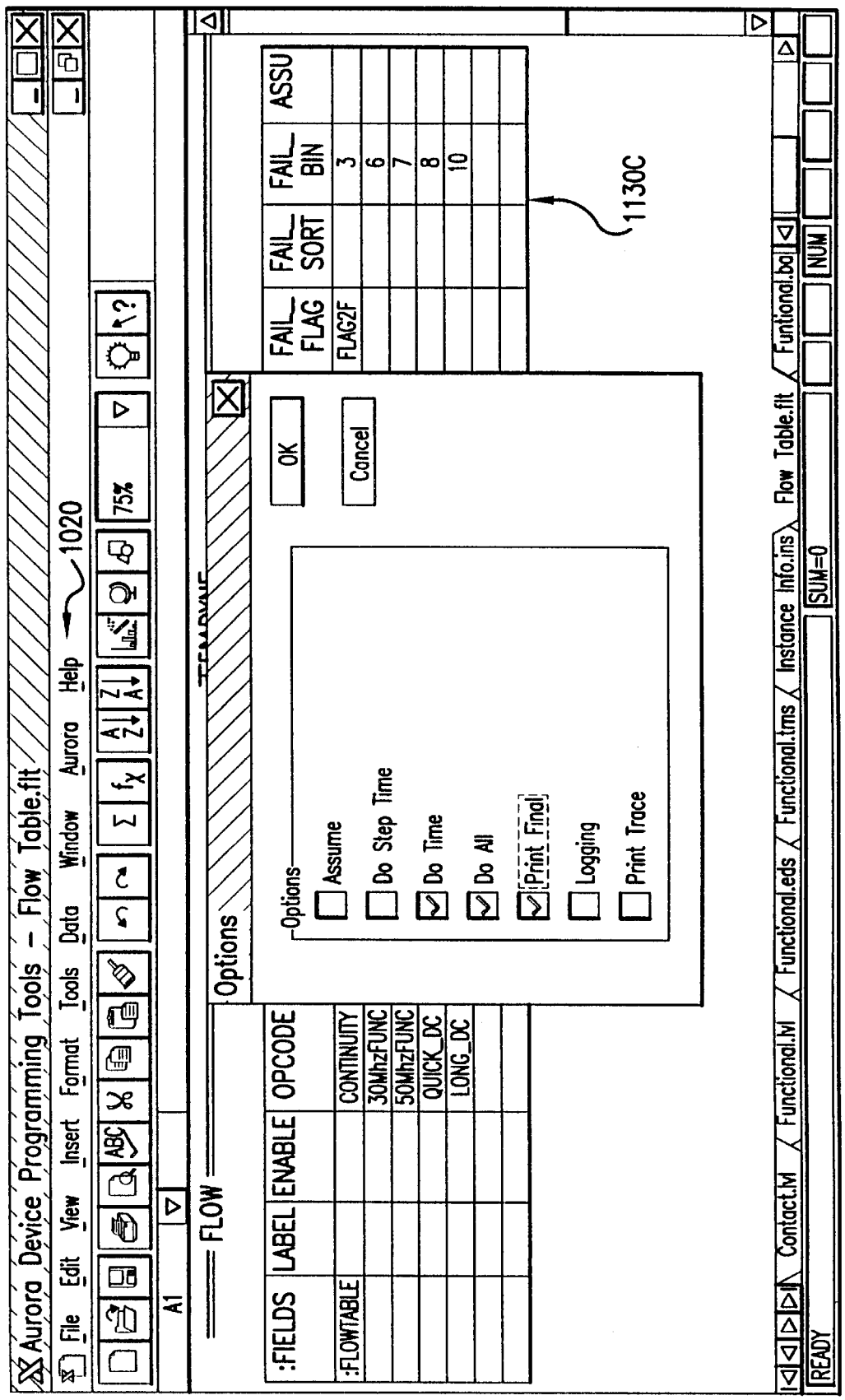

FIG. 11C shows an alternative way in which flow control information can be specified. FIG. 11C shows a pop-up options box that can be used to specify options that modify the option of low control software 314 (FIG. 3). Options are specified by a human test engineer by clicking on the choices in the dialog box. For example, the "Do All" option causes flow control software 314 to run all steps in the program flow even if one step fails. When this option is not selected, the test of a particular part stops once one of the tests fails. As another example, "Print Final" option causes the results of the tests to be printed once the test job is completed. If not selected, the results are not printed but are stored until read by a user. As a further example, the "Do Time" option causes the flow control software to record the time at the start of a job and also at the end of a job so that the length of time the job took can be recorded. As is described below, the flow data sheet is converted into a flow data structure. The options specified influence the exact way in which that conversion is made.

Figure 12A:
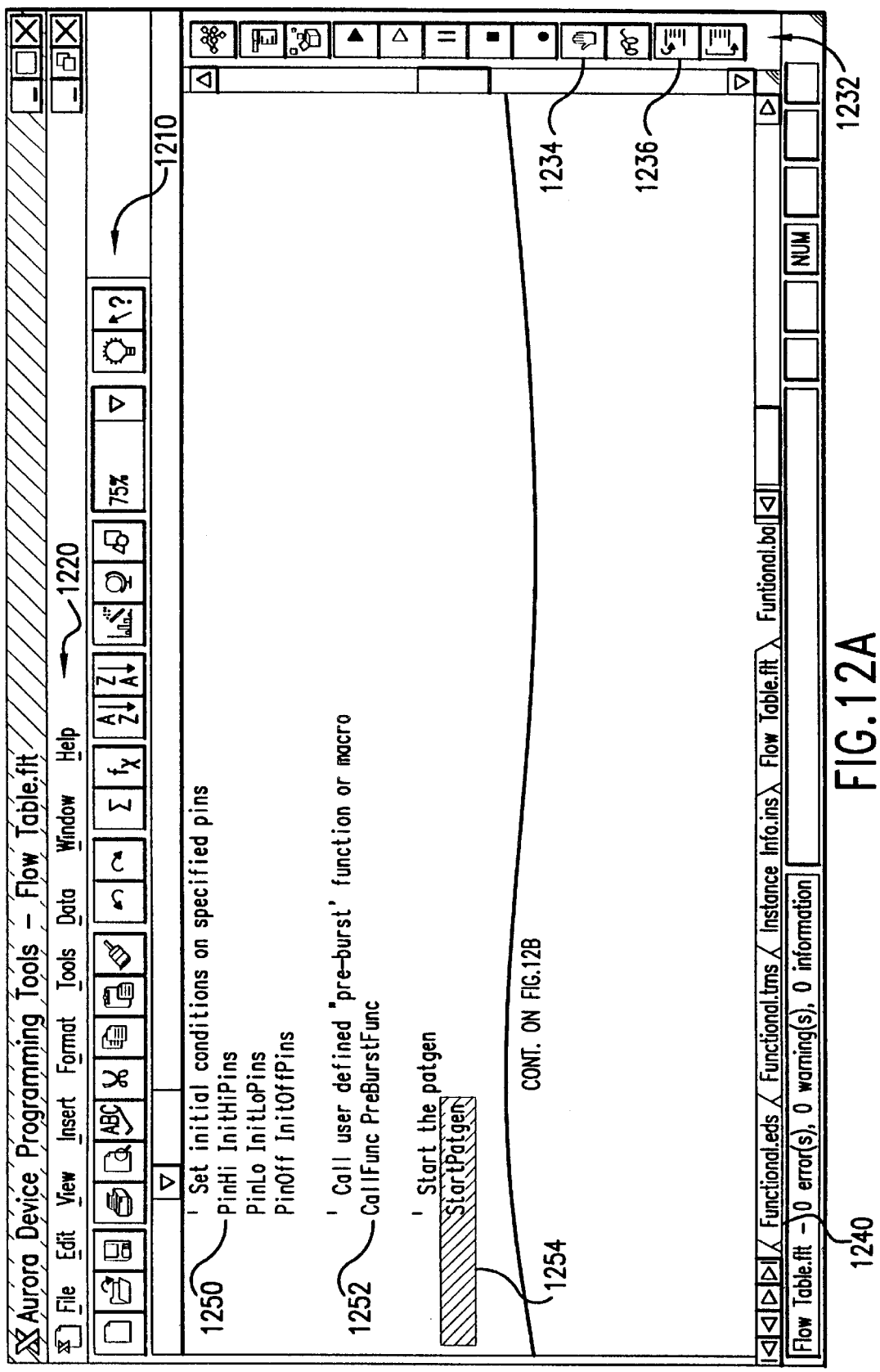
FIG. 12 shows a sample test template.
Figure 12B:
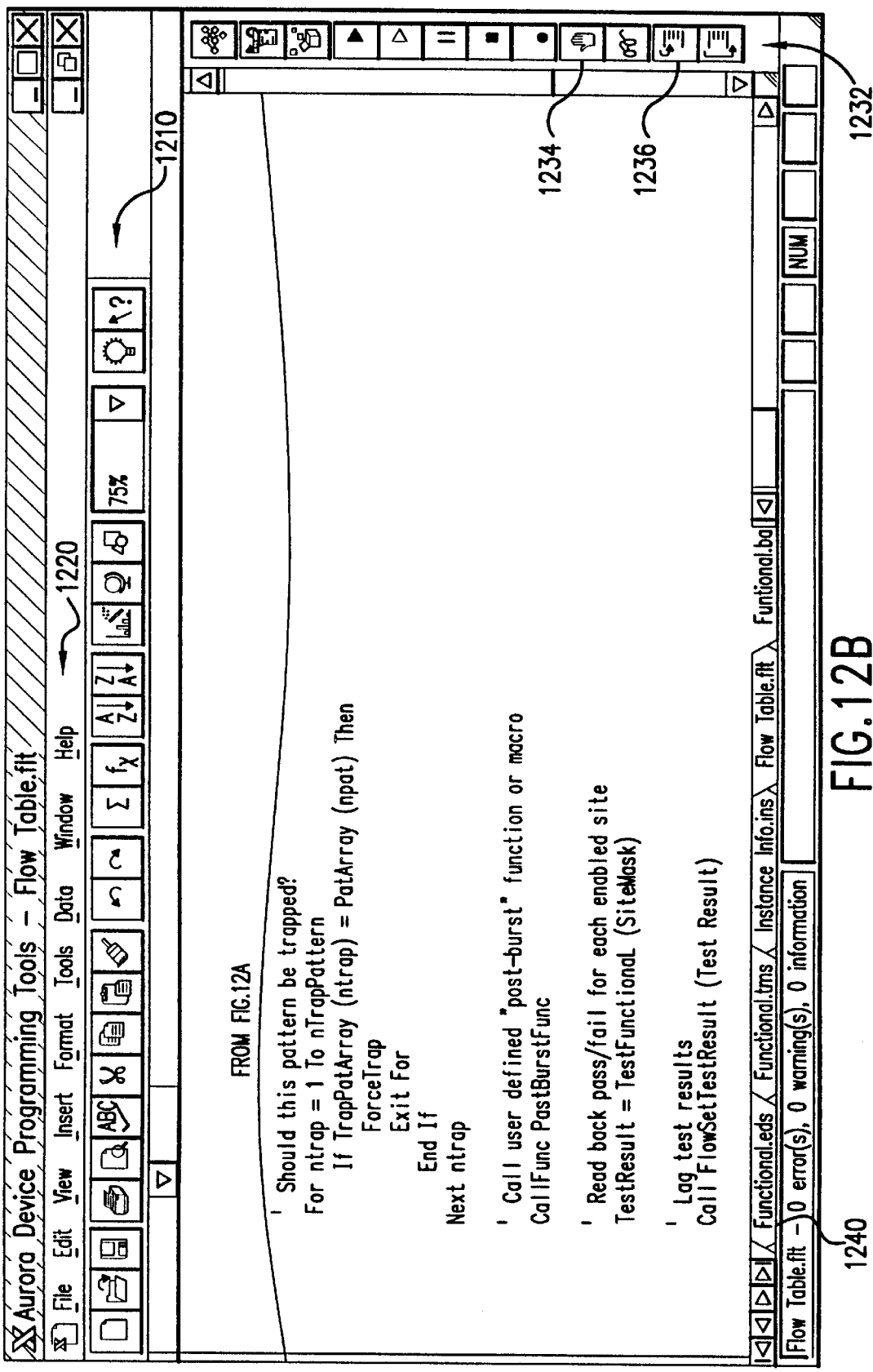

FIG. 12 shows a sample of a test template. The test template is written in Visual Basic, a programming language that can be used to write macros attached to a spread sheet. Each macro could be used as a procedure in a programming language and can therefore be used as test templates.

Several important points can be observed in FIG. 12. First, the overall programming environment is the same as is used to enter information in the device data and flow spread sheets. It has the same tool bar 1210, menu bar 1220 and tab field 1240. Instead of a data field, though, the test template screen includes lines of program code.

Each line of program code could call other procedures developed by the tester manufacturer or written by the user.

Lines 1250 and 1254 represent calls to functions provided by the tester manufacturer. At line 1250 "PinHi" is a procedure that accesses one of the device drivers 328 (FIG. 3) and sets specified pins to a high state. At line 1254, "StartPatgen" is a similar function that starts timing and sequencing circuit 120 (FIG. 1) running.

FIG. 12 also shows debug tool bar 1232. When a new semiconductor device is first being developed, it is necessary for the device engineer to measure the actual performance of the device to assess whether it has been designed properly. When a defect is detected, the device engineer wants to be able to figure out exactly what went wrong. To do this, the device engineer uses the tester in "debug mode." The device engineer controls the tester to execute one operation at a time so that the results of each operation can be analyzed. Debug tool bar 1232 contains tools that are used during debug operations. Debug tool bar 1232 is preferably provided as part of the commercially available spread sheet program.

Debug tool bar 1232 contains tools that perform various debug functions. For example, tool 1234 sets a break point in the code. Line 1254 is highlighted to indicate that a breakpoint is set at that line. During execution of a test, prior to the execution of a line marked with a break point, execution stops. The device engineer can then check the state of the tester or the device.

Once execution is stopped at a break point, other tools on debug tool bar 1232 control how execution continues. For example, tool 1236 allows execution to go step by step into every procedure that follows. In contrast, other tools allow procedures to be skipped over, while yet other tools allow certain values to be examined. In this way, the device engineer can observe much about the operation of the device. The same debug tools can also be used by a test engineer developing a test for the device under test. Significantly, all of these capabilities are provided at a very low cost by using a commercially available spread sheet program having associated with it a programming language with debug tools.

Once the data and flow information for a test job is entered by a test engineer or other user of the system, the software in work station 110 can be run to control a test job. As shown in FIG. 3, execution of the test job is performed by flow control software 314 in response to a user input. In the illustrated embodiment, flow control software 314 is implemented as a C++ program. More specifically, it is a DLL.

Figure 13:
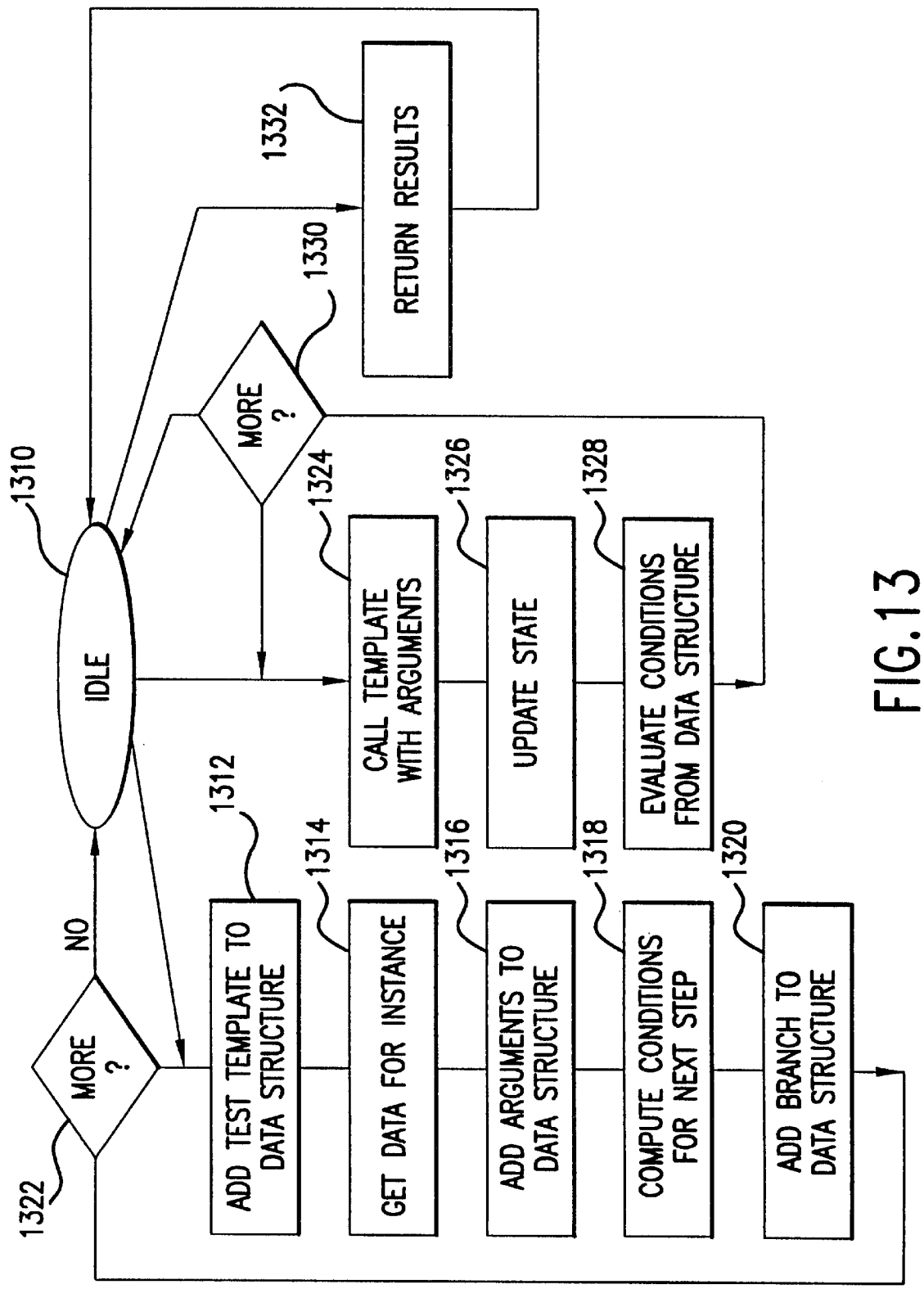
FIG. 13 is a diagram illustrating the operation of flow control software in accordance with the invention.

FIG. 13 is a flow chart explaining the operation of flow control software 314. Flow control software 314 starts off in idle sate 1310. Flow control software 314 can perform one of three different actions, depending on inputs to the software. One action flow control software 314 might take is to organize the data for a test job into a data structure that can be accessed during a test job. As described in conjunction with FIGS. 10 and 11, a test job is specified as a list of instances and instances are specified by an association of particular device data with certain templates. In addition, the order in which the specific instances are executed might be influenced by conditions entered into the program flow data sheet.

In response to a user command, flow control software 314 builds a job control data structure that lists each template that is to be executed and the data that is to be used for execution of that template. Where the order of execution of the templates can be determined from the conditions, it is resolved before the templates are placed into the job control data structure. However, where the order of execution of the templates is not resolved until the test job is run, the job control data structure simply includes information on the conditions which are evaluated to determine the order in which the templates are executed. The job control data structure could be an indexed list, but other implementations are possible.

In building the job control data structure, execution proceeds to step 1312. At step 1312, the first template is determined. The template is determined from the first instance in the flow data sheet. The template associated with this instance is determined from the instance data sheet. A notation for the template is entered into the job control data structure. In a preferred embodiment, the notation indicates the name of the subprogram to call to execute the template.

At step 1314, the data that is passed upon the call of the selected template subprogram is identified. Which data to use is determined from the instance data sheet.

At step 1316, an identification of the data to be used for the specified test template is added to the job control data structure. As shown in FIG. 3, data manager passes data from the Excel workbook to the device drivers for application to the tester 112 (FIG. 1). As will be described in detail below, data manager 316 assembles parameter data structures that hold the specific data passed to tester 112 during a test job. The data in the parameter data structure is organized into "containers" so that the right data can be selected from the parameter data structure by providing the data with the name of the right "container". The arguments that are to be added to the flow control data structure specify the correct "container" that data manager 316 selects from the parameter data structure. This information, in a preferred embodiment, is represented as a text string selected based on the name given to the data sheet. The same text string is associated with the container. However, other ways to identify a container could alternatively be used.

In addition to arguments that represent the names of "containers", arguments that are data values could also be used by a particular template and could also be added to the parameter data structure.

Once information to identify the templates and the data values are added to the job control data structure, execution proceeds to step 1318. At step 1318, the conditions for executing the next template specified in the flow sheet are determined. The conditions are computed to determine every possible instance in the flow sheet that could be the next instance to execute. In addition, the conditions under which each of the instances would be the next is expressed as a logical equation. Variables are used for values that must be evaluated during a test job. These logical expressions are entered into the job control data structure at step 1320. The logical expressions are used as conditions to what can be equated to branching instructions in a traditional programming language.

Once the information for one row of the flow control sheet is entered, execution proceeds to step 1322. Step 1322 checks whether there are additional rows in the flow control data sheet. If so, execution loops to step 1312. If there are no additional rows in the flow control data sheet, flow control software 314 returns to idle state 1310.

When flow control software 314 is in its idle state, it might receive a command from a user to run a test job or it might receive a start signal from handling device 114, indicating that a device under test has been loaded and is ready for testing. When the command to run a test job is received, execution proceeds to step 1324. At step 1324, the first template from the job control data structure is read. The template is called as a subprogram with the specified arguments from the job control data structure. The template subprogram then executes and returns to flow control software 314.

Each template subprogram that represents a test indicates whether the test passes or fails. One way that the results of the tests could be indicated is if the template subprogram is coded to return a value to the calling program that indicates the results of the test conducted by that subprogram template. Alternatively, the template, or a device driver if appropriate, can call a function within the flow DLL that checks the state of the tester to determine whether the test passed or failed. At step 1326, the state of the test job is updated based on the value returned by the test template that was just called. For example, the test will indicate whether a test template executed without detecting an error (i.e. the test passed) or whether an error was detected. In some instances, the errors will have numerical values that facilitate binning of the device under test.

At step 1328, the new state of the test is used to evaluate the logical expression stored in the job flow data structure at step 1328. Based on that evaluation, the next template is selected, based on the branching information stored at step 1320.

Execution then proceeds to step 1330. Step 1330 evaluates whether there is another template to execute. If so, job execution loops back to step 1324. If there are no additional templates, flow control software 314 returns to its idle state.

In the preferred embodiment, the results of a test job are not presented to a user or to the handling device 114 as the test completes. Presenting data slows execution of the test job. Therefore, in the preferred embodiment, results of the execution of each test job are stored in computer memory until a request is made. The request for results causes flow control software 314 to pass from idle state 1310 to step 1332. At step 1332, the results can be displayed for a human user or passed to a handling device 114. The results can be formatted for display in a manner convenient to a user or appropriate for a handling device.

Greater detail on Data Manager 316 will now be presented. Data manager 316 consists of a series of C++ "classes." Classes do not have a state diagram associated with them. They perform operations in response to requests from other programming elements. Classes have "methods" associated with them. Each method can be called like a conventional programming function to access data stored within the classes.

The C++ methods can be called directly by other C++ programs. In the embodiment of FIG. 3, device drivers 328, because they are implemented as C++ procedures, can call the methods to read or change data in the data manager 316 directly. The Excel workbook, not being in C++, requires APIs—Applications Program Interfaces—to call the methods that store or retrieve data from the data manager 316. However, APIs are well known programming structures. Data is passed between the Excel programs, including Visual Basic macros, and data manager 316 in a format termed a "SafeArray". A SafeArray is part of the Microsoft OLE (Object Linking and Embedding Language) that can be used with Microsoft Excel commercially available spread sheet program.

Data Manager 316 is implemented as a series of memory structures called "containers". The format of the container depends on the type of data to be stored. For example, pin map data is stored in a container with a different format than the container that holds level sheet data. The format of the container is defined using known programming techniques based on the information that is to be stored.

The containers can be nested. For example, within a container for a pin map, there might be several pin groups. Within each pin group, there might be several pins. In this example, the container has three levels of nesting. However, any level of nesting might be possible.

The C++ STL (Standard Template Library) includes methods that are useful for manipulating data within classes. Two of these methods are "MAP" and "VECTOR". In general, "containers" are allocated in the computer memory in the order in which they are created by the program rather than in logical order. However, to make retrieving the information easier, a set of "keys" is created between the names of the containers and their physical location in memory. The "keys" act like an index so that desired data can be found by finding the correct key.

The MAP method creates a set of keys that is branched, like a binary tree. The VECTOR method creates an index that is ordered, like a list. The advantage of the MAP method is that a random item can be found quickly. The disadvantage of the MAP method is that ordering is lost. For example, the order of pins in a pinmap data sheet is important information for a test program. Using just the MAP method would result in that order being lost. The methods for storing data in data manager 316 uses a combination of the MAP and VECOTR STLs to achieve the benefits of each.

In addition to store and retrieve functions, data manager 316 contains other methods to perform the required data management functions. One of the additional functions is a SELECT DEFAULT function. As described above, there can be multiple sets of data for a specific class of data. For example, there can be multiple pin maps in one test job. The SELECT DEFAULT method indicates which set of data is to be used as a default. For example, if a test job has two pin maps, PIN MAP1 and PIN MAP2, PIN MAP1 might be set to the default. Any use of a retrieve function to retrieve pin map data would get the data from PIN MAP1 unless PIN MAP2 were expressly indicated when the retrieve operation was performed.

A SELECT ACTIVE method might also be included in data manager 316. That method would be similar to the SELECT DEFAULT, but would specify the container that would be used.

Another method that could be included would be a REPLACE method. As described above, data manager 316 is a series of containers for data for a test job to test a particular device. It might be desirable during development of a test job, or between tests in a particular job, to change some of the data for the device. The REPLACE method allows one set of data to be replaced by another. For example, if a user edited a device pin map spread sheet as part of the process of developing a test job, a macro associated with the pin map data sheet might automatically call the REPLACE method to ensure that the new data is used when the test job is executed. Rather than being automatically executed when data is changed, the REPLACE method might be called by a macro that operates in response to a user input.

A similar method is needed if data in the data manager is changed by one of the device drivers 328. As has been described, data manager 316 essentially keeps a copy of the data that is separate from the data that is kept within the Excel workbook. Changes within the Excel workbook are reflected in the data manager by the REPLACE method. If the data within the data manager is changed not within the workbook, a REPLICATE method is needed. For example, if the device driver changes a value within one of the containers in the data manager, the data manager might call the REPLICATE method.

The REPLICATE method calls an Excel tool that reads the current data back from data manager 316. The data is loaded into the appropriate Excel spread sheet, which causes the Excel functions associated with the workbook to recalculate any data dependent on the changed data. Then, the data in any spread sheet that was changed is replaced in the data manager. Test templates that perform operations that change the data stored by the data manager use the REPLICATE method when they have completed execution.

Operation

The structure of the software for controlling tester 112 has been described. Many uses of the software could be possible. One likely use is that the software will be used first to develop a test job and then to execute that test job repeatedly during production of semiconductor devices. A likely use would be that a device engineer would first edit test templates 320, if required. It is intended that a very small number of test templates can test many kinds of devices. Therefore, editing of test templates is unlikely to be required.

The next step that a developer of a semiconductor test device might take would be to employ the device data and flow development tools 310 (FIG. 3). These tools are accessed by opening an Excel workbook for the specific device being developed. Specifically, these tools represent the spread sheets that are depicted in FIGS. 4 through 11. Macros or wizards might be employed to guide the user through these forms. Validation macros might be run once data entry for a particular sheet is completed so that any data that is inconsistent with other data might be detected and corrected. For example, a programmer might enter data values for a particular pin that was not in the pin map. Such an input would indicate an error, either because the pin was inadvertently left out of the pin map or because the wrong name had been used for a particular pin.

In a preferred embodiment, the software is coded such that a test job will not run if data has been entered or changed and not been validated. Validation can be selected by the user from the custom menu bar.

Once the data is entered, a user would select a "compile" option. In a preferred embodiment, the compile option is selected from the custom menu item associated with the flow data sheet. The compile option triggers flow control software 314 to construct the job flow data structure. It also causes methods within the data manager 316 to transfer the data from the Excel work book to the data manager.

In the development environment, the test engineer would then begin the process of debugging the program. Possibly the engineer might connect a device to tester 112. Alternatively, the test engineer might debug the test program using a simulator. A simulator is a software program that simulates the operation of tester 112 with a device connected to it.

The engineer might use the debugging tools as described above to step through the program. As the test engineer detects errors in the programs, the engineer might edit the test templates. Because the test templates are written in Visual Basic, which is an interpreted language, the changes could take effect immediately, without recompiling the test job.

Alternatively, the test engineer might need to change some of the data in one of the device data structures. The test engineer would access the data through the spread sheet screens shown in FIGS. 4–11. The validation process would then be run again. As part of the validation process, the REPLACE tool is run automatically. Automatically using the REPLACE tool ensures that data manager 316 provides up to date data.

If, as part of debugging, the test engineer changes the program flow, the flow would have to be recompiled such that a new job flow structure could be built.

Once the required changes are made to the device date, test templates or device flows, the test job could then be run again. The time required to make the changes to the test program can be very short. In some prior art systems, any changes, even very small ones, to the test job required complete recompilation. As a result, any change might take up to an hour. With the invention, changes to templates do not require any recompilation. Changes to device data requires that only the changed data be reloaded. It is only the program flow that has to be compiled, if changed. Because the compilation deals only with the flow, and not all of the data, it can be performed in a matter of seconds.

In a typical development setting, the test engineer would iteratively repeat the process of changing the test job until the test job performs as expected. Once completed, the test job would be transferred to a production setting. In a production setting, the device data and flow development tools are not used. Likely, a custom interface is developed. The custom interface provides only the controls needed to run the tester to test a part and displays only basic output information to let an operator know that testing is progressing. Though a tester can measure and store much data, very little of it is presented to the operator in the production environment.

Where the software is implemented using Excel, Visual Basic programming language is available to prepare a custom production interface. The likely things in the interface are a control to start testing, to stop testing and a display indicating the number of devices that have failed certain tests.

Other Embodiments

Having described one embodiment, numerous alternative embodiments or variations might be made. For example, the invention is described in conjunction with a tester having a body and a separate computerized work station. It is not necessary that the computerized work station be physically separate from the tester body. It might, for example, be built into the tester body. Other configurations are possible. For example, some testers have a main frame and a test head. For purposes of this invention, the tester could be in one or several different packages.

Examples of specific data and flow sheets have been given. Each row was shown with a specific number of columns, with each column containing a specific type of information about an item or step in the flow. Depending on the types that are to be run, the hardware of the tester or requirements of a device to be tested, the number and kinds of information that are included in each row could be different. More or less columns could be available. One possibility is to have a super set of possible columns for each type of spread sheet. A user could then pick which columns were important to the particular job. A Wizard could be provided to guide a programmer through the selection process. A Wizard is a macro that prompts a user to make choices. Those columns in the super set which were not selected for display on a particular screen could be omitted entirely from the spread sheet or could be present but not displayed. Columns that were present but not displayed would then either be ignored or given default values.

We have described flow control software 314 as being written in C++. It is widely believed that C++ can be made to execute more quickly that Visual Basic, which is the programming language that is part of the Excel commercially available spread sheet program. However, we have recognized that, though the flow control software executes faster if written in C++, the time for interfacing to the device and flow data input using the Excel program is slower. Thus, in some instances, it will be preferable to have flow control software implemented in Visual Basic or other macro programming language that is part of the commercially available spread sheet program.

It was described in conjunction with FIG. 13 that flow control software 314 is controlling a test job that tests a single part. Tester 112 likely has hundreds to thousands of pins 124. It is therefore possible that there are enough pins to connect multiple parts to tester 112 at the same time. In this case, the pins are grouped into "sites." The pins in each site get the same data and make the same measurements. However, if one site detects an error, different processing might be required on that site. Therefore, flow control software 314 could be structured to run tests on multiple sites simultaneously. However, if any site failed, that site would be tested separately. To perform this function, step 1326 might be altered to track the state of the sites separately. Step 1328 could then be altered to select templates for each site, depending on whether the device at each site had passed or failed some test in the test job.

Also, it has been described that the test system tests semiconductor components. Similar software might be employed to control test systems for printed circuit boards or other devices.

Figure 14:
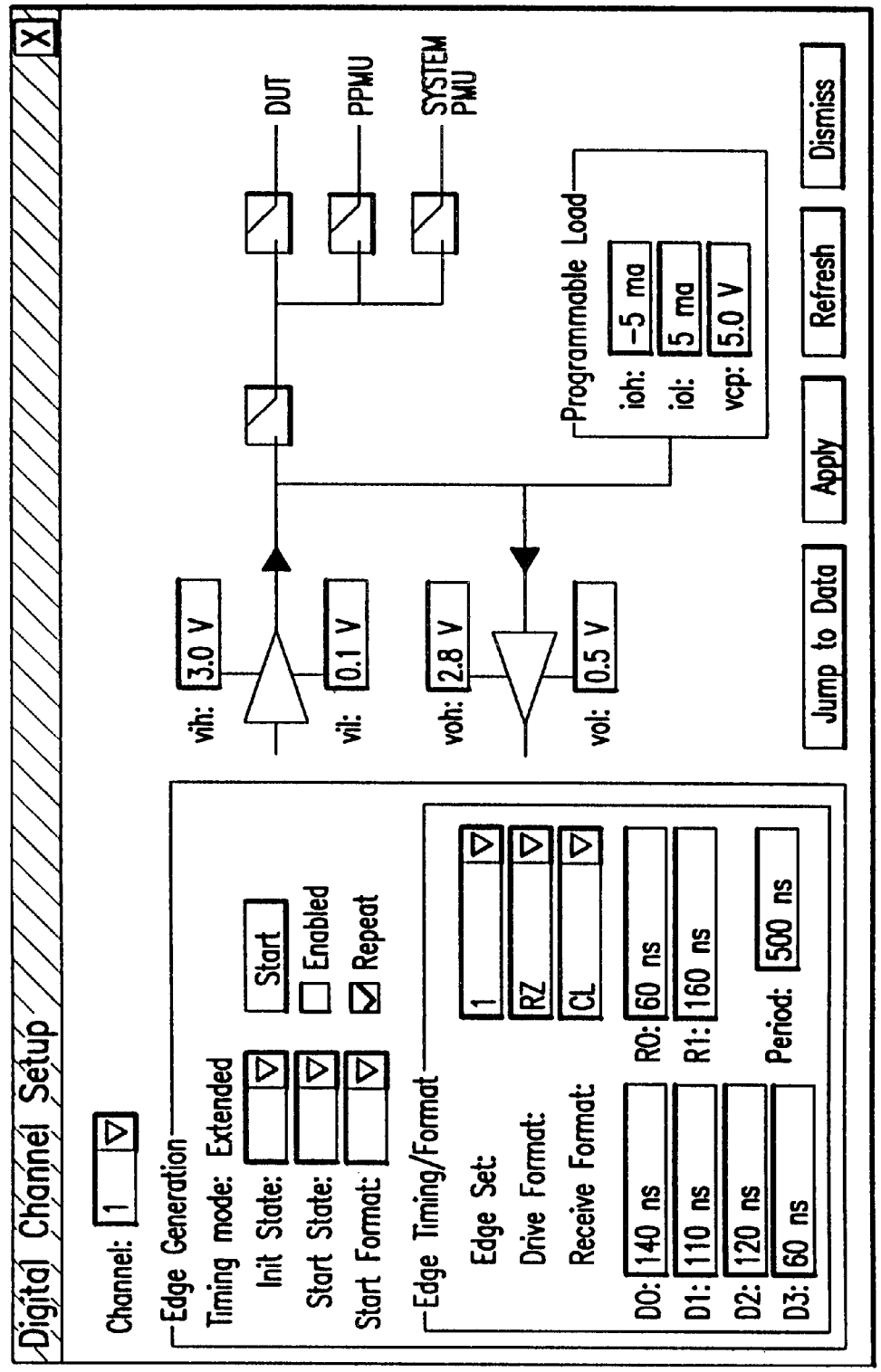
FIG. 14 is an optional programming interface that can be easily implemented in accordance with the invention.

In addition, it has been described that the use of a commercially available spread sheet program enables the software to control a test system to be quickly implemented in a manner that can be easily understood by a user. FIG. 14 shows an example of another tool that can be implemented. FIG. 14 shows a tool that is primarily intended to be used as a debug or analysis tool. Here, a data input screen is shown. The screen is implemented as a dialog box using Visual Basic rather than as a spread sheet. The particular example of FIG. 14 relates to the hardware setup of a single pin 124 (FIG. 1). The dialog box contains several fields into which data can be entered. The data represents values that are passed to the hardware in the tester. When this dialog box is used, it bypasses the normal data path through flow control 314 and calls device drivers 328 directly to access the tester hardware.

Figure 15:
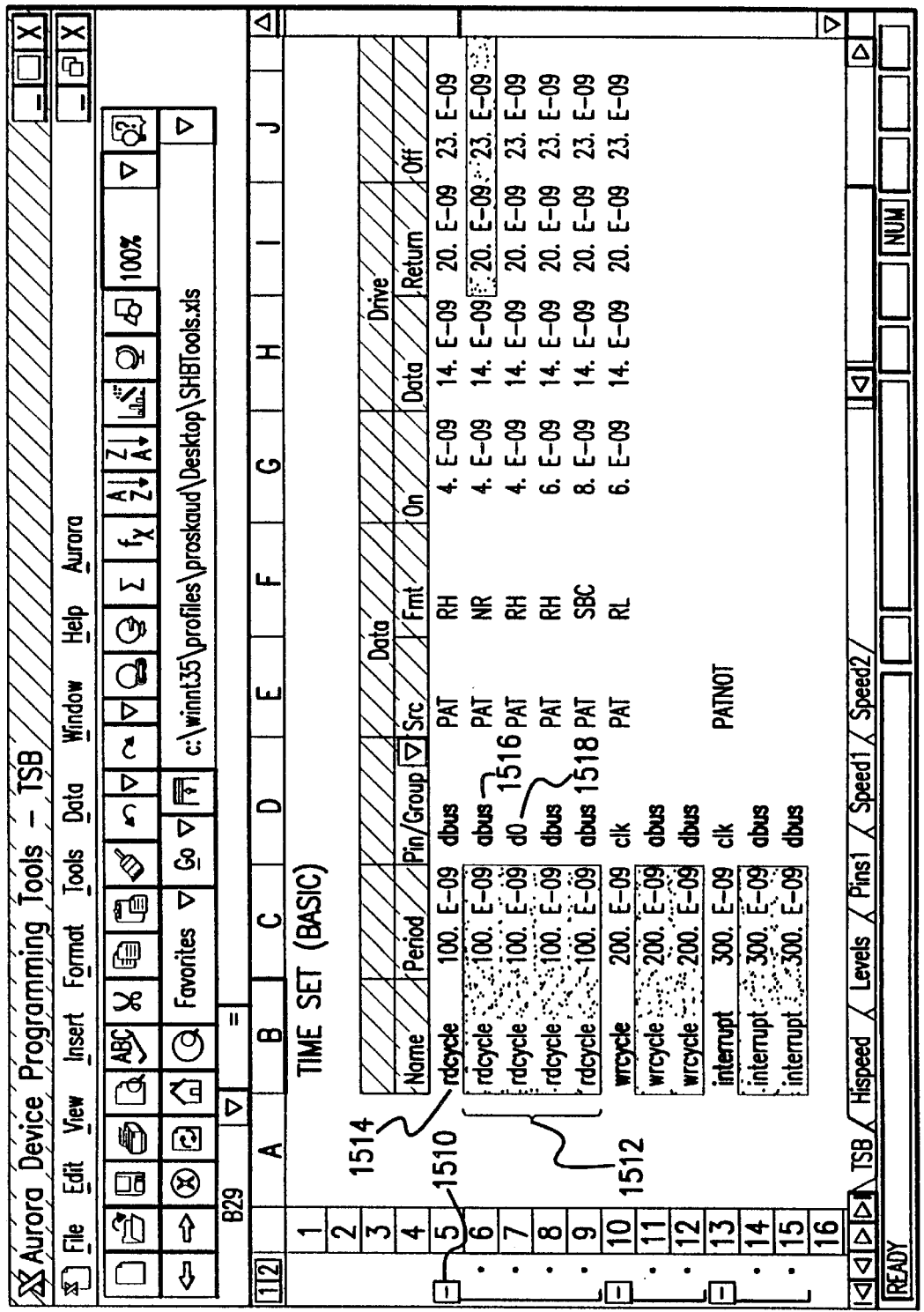
FIG. 15 is an example of a device data sheet implemented using an alternative commercially available spread sheet program.

As another example of a possible variation, the commercially available spread sheet program might be other than Excel or versions of Excel other than those pictured might be used. FIG. 15 shows an example of a data entry screen implemented with Excel '97, a commercially available spread sheet program sold by Microsoft. Several additional features are possible through the use of Excel '97. Control elements 1510 are group display controls. When multiple rows of data are within the same group, the display can be collapsed such that only a single row is dedicated to display that group. In FIG. 15, for example, the rows indicated at 1512 and 1514 are all in the time set named "rdcycle." All the rows are shown and the group is said to be expanded. However, if group display control 1510 is used, only a single row would be shown for that group. Even though the other rows are not visible, they would still be acted upon by any operation performed using the data entry screen of FIG. 15.

Another feature that might be employed through the use of Excel '97 is making data look different based on its type. For example, the data in cell 1516 has a different appearance that the data in cell 1518. That is because the data in cell 1516 has been assigned a type for an address bus and the data in cell 1518 has been assigned a type for a data bus. Making the different types of data visually distinctive makes the software easier to use.

Figure 16A:
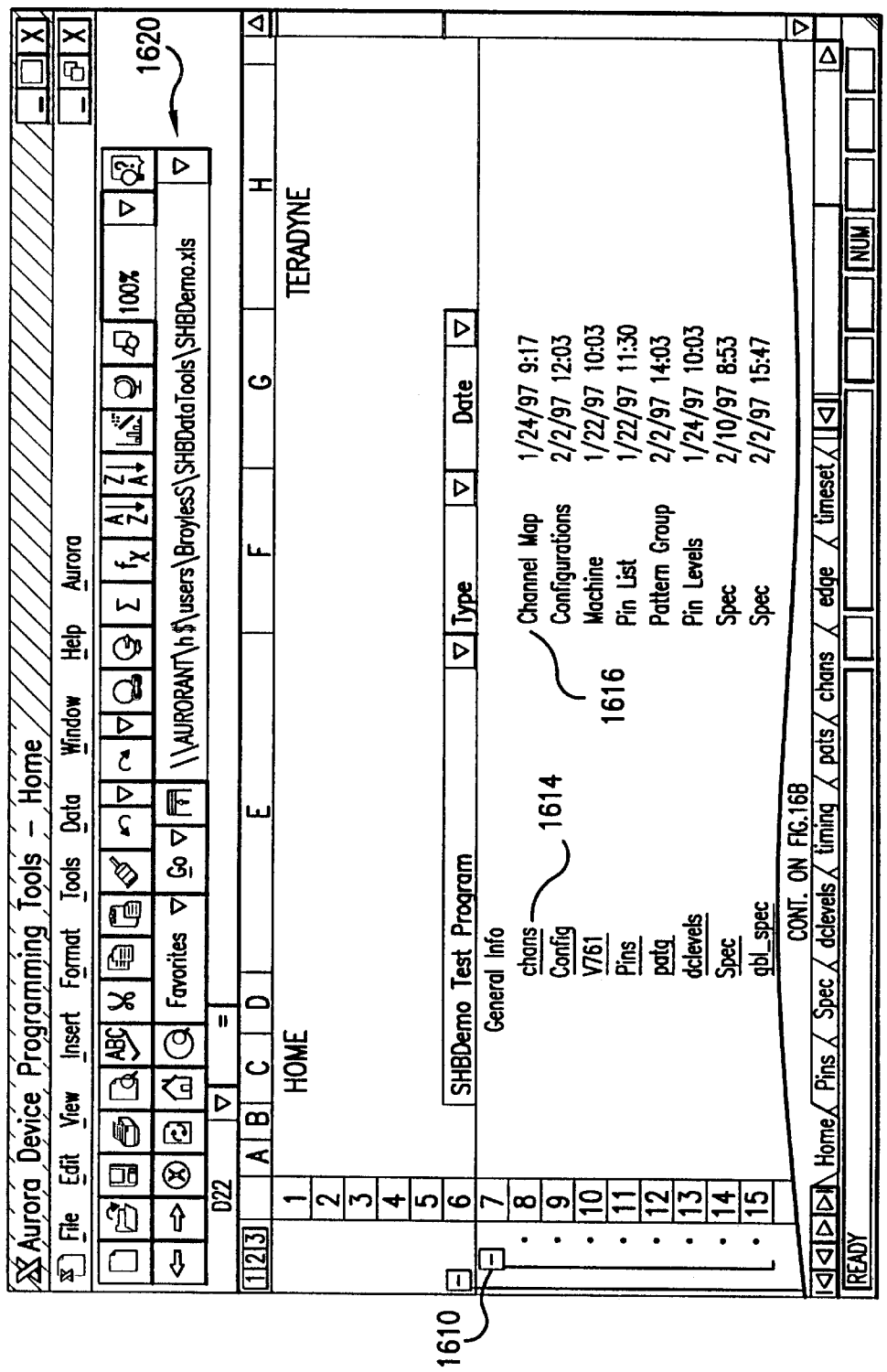
FIG. 16 is an example of an optional device data and flow development tool.
Figure 16B:
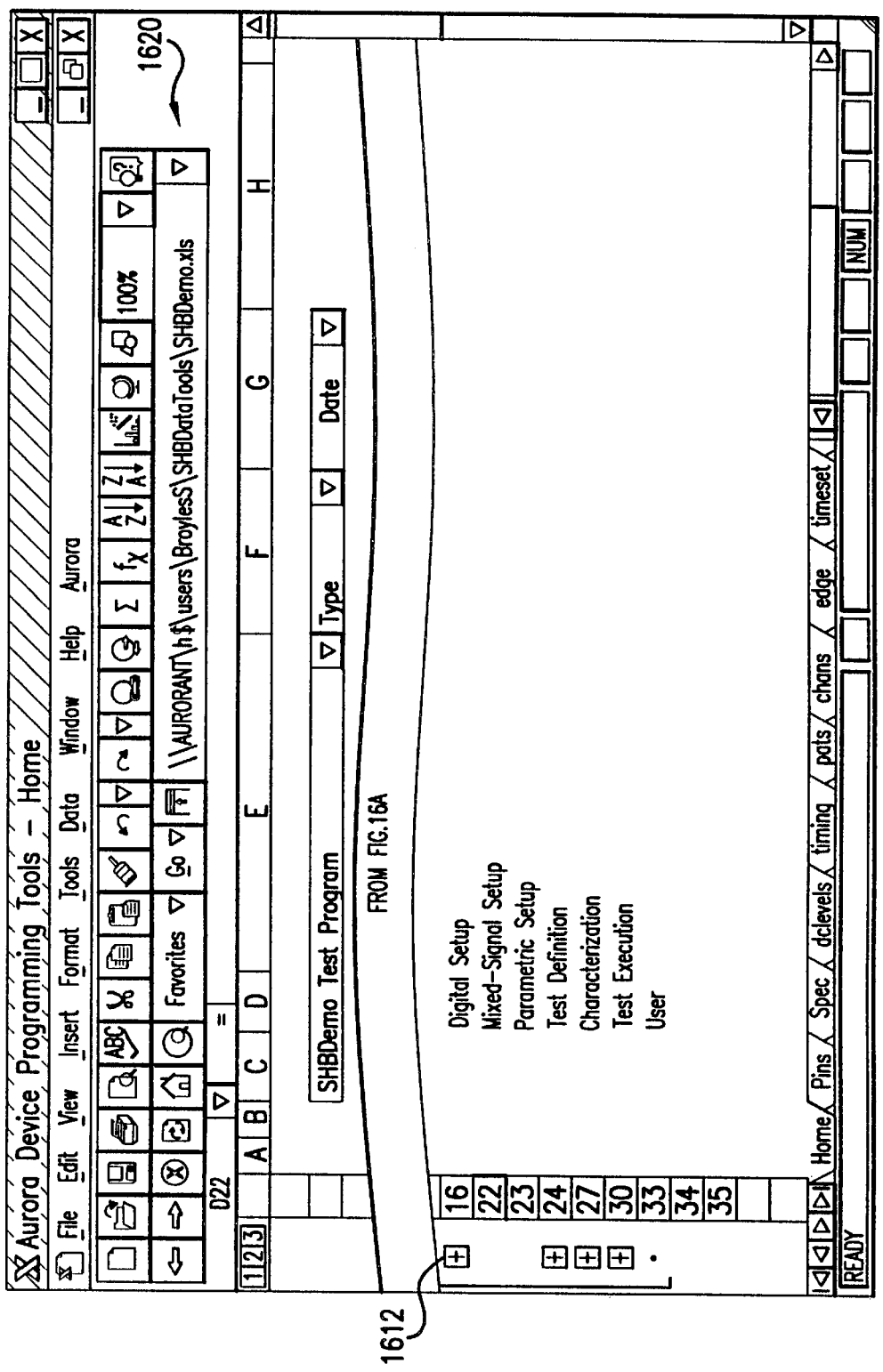

FIG. 16 illustrates other enhancements that might be made. Group control element 1610 is shown in its expanded state. Thus, there is a list of elements shown for the group indicated as "General Info." In contrast, group control 1612 is shown in its unexpanded state. Thus, no entries are shown for the group "Digital Setup."

FIG. 16 also emphasizes the advantage of making groups appear visually distinctive. For example, fields 1614 and 1616 appear different because they contain data of different types.

Another feature shown in FIG. 16 is the navigation feature. In the preceeding examples, tools were accessed by selecting tabs on the bottom of the screen. FIG. 16 demonstrates that the screens can be linked together with "hot links." By clicking on the name of a screen from another screen, a user can change the screen display. Also, a navigation tool bar contains tools that are useful for finding a desired data screen. Navigation tool bar contains tools as might be found in an Internet navigator. The tools perform such operations as move to prior screen or go to a prespecified favorite screen.

Another advantage of using Excel '97 is that it is an object oriented language. Each data screen is an object. Each object, such as a data screen, has a class associated with it. All data sheets can be given a base class, which defines the operations that are common to any data sheet. For example, error handling, data types and formatting can be defined in the base class. Other functions, such as validate data and send data to data manager, which are performed by all data sheets, can be defined as "public methods" for the base class. In this way, all of these capabilities are provided for all data screens, even though they are specified just once. Equally importantly, each device data or flow data tool operates in the same way.

Another variation made possible through the use of object oriented programming is to have instantaneous validation of inter-sheet errors. Validation rules can be specified and data is checked as it is entered. A validation routine that checks for inconsistent data between multiple sheets might be still be run.

Therefore, the invention should be limited only by the spirit and scope of the appended claims.

What is claimed is:

1. A semiconductor test system of the type having a body holding electronic circuitry for generating and measuring a plurality of test signals and a computer work station providing control information to the electronic circuitry within the body, the semiconductor test system additionally having controlling software within the computer work station, the controlling software comprising:

a) a spread sheet program having a plurality of types of spread sheets, with a first portion of the plurality of types of spread sheets configured to hold data about a device under test and a second portion of the plurality of types of spread sheets configured to hold information influencing the steps performed during a test job on a semiconductor device;

b) a plurality of device driver program elements, each controlling a portion of the electronic circuitry within the body; and c) program means for receiving data from the second portion of the plurality of types of spread sheets and controlling execution of a test job by providing data from spread sheets of the first type to selected ones of the plurality of program elements in an order dictated by data in spread sheets of the second type.

2. The test system of claim 1 wherein the spread sheet program is a commercially available spread sheet program and includes an integrated programming language integrated to read data from spread sheets and the program means includes flow control software written in the integrated programming language.

3. The test system of claim 2 wherein the integrated programming language is Visual Basic.

4. The test system of claim 1 wherein the plurality of types of spread sheets are organized into a workbook, with data in one spread sheet within the work book being accessible from another spread sheet within the work book.

5. The test system of claim 1 wherein the spread sheet program is a commercially available Excel spread sheet program.

6. The semiconductor test system of claim 1 wherein the program means comprises:

a) flow control program means for calling selected ones of the device driver program elements in an order determined by the information in a spread sheet in the second portion of the plurality of types of spread sheets;

b) data retrieval program means, called by the device driver program elements, for returning values determined by information in a spread sheet in first portion of the plurality of types of spread sheets.

7. A semiconductor test system of the type having a body holding electronic circuitry for generating and measuring a plurality of test signals and a computer work station providing control information to the electronic circuitry within the body, the semiconductor test system additionally having controlling software within the computer work station, the controlling software comprising:

a) a commercially available spread sheet program having a plurality of types of spread sheets, with a first portion of the plurality of types of spread sheets configured to hold data about a device under test and a second portion of the plurality of types of spread sheets configured to hold information influencing the steps performed during a test job on a semiconductor device;

b) a plurality of device driver program elements, each controlling a portion of the electronic circuitry within the body; and c) program means for receiving data from the second portion of the plurality of types of spread sheets and controlling execution of a test job by providing data from spread sheets of the first type to selected ones of the plurality of program elements in an order dictated by data in spread sheets of the second type; and d) a plurality of test program elements, each of which represents a function performed during one step of the test job, and wherein a spread sheet in the second portion of the plurality spread sheets is a flow sheet which comprises a plurality of rows, with at least a portion of the plurality of rows each including:

i) a reference to a test program element; and ii) an indication of a classification to be assigned to the device under test if the referenced test, when performed, indicates a failure.

8. The test system of claim 7 wherein at least a portion of the plurality of rows in a flow sheet each additionally includes:

a) the name of a flag to be set be set when the referenced test fails;

b) a cell representing a boolean expression that indicates whether the referenced test should be performed, the boolean expression in one row including the names of flags included in other rows.

9. The test system of claim 8 wherein each flow sheet additionally has associated with it means for entering arguments that modify the execution of the test job.

10. The test system of claim 7 wherein each of the test program elements comprises a test template and a spread sheet in the second portion of the plurality spread sheets is an instance sheet which comprises a plurality of rows, with at least a portion of the plurality of rows each defining an instance of the test template and including:

a) a reference to a test template;

b) an identifier for the test instance, the instance sheet additionally comprising means for specifying selected ones of the spread sheets configured to hold data about a device under test to be combined with the test template to form the test instance and wherein the reference to a test program element in the flow sheet comprises the identifier for a test instance.

11. The test system of claim 10 wherein each of the test templates is written in an interpreted programming language.

12. An automatic test system having control software stored on computer readable media to generate a plurality of data input screens, in which data on the device under test and data on the flow of the test program are entered in screens that have similar layouts, each of the screens comprising:

a) a data cell field having a plurality of data cells organized in rows and columns, each column holding data of a common type, with data cells in a first portion of the screens holding data on a semiconductor device under test and data cells in a second portion of the screens holding data on the flow of test program execution for the semiconductor device under test;

b) a tool bar field having a plurality of tool icons, wherein the tool icons represent manipulating functions that alter either the semiconductor device data or the test program execution flow data;

c) a tab field, each tab being selectable to access a different data input screen; and d) a menu bar field, having a plurality of menu items thereon, each of the menu items being selectable to reveal a plurality of sub-menu items, the sub-menu items under at least one of the menu items being selected in response to the selected tab field.

13. The automatic test equipment of claim 12 wherein the software is implemented as an application in a commercially available spread sheet program.

14. The automatic test equipment of claim 13 wherein the commercially available spread sheet program is Excel.

* * * * *